US007002728B2

(12) United States Patent
Pullen et al.

(10) Patent No.: US 7,002,728 B2
(45) Date of Patent: Feb. 21, 2006

(54) ELECTROPHORETIC PARTICLES, AND PROCESSES FOR THE PRODUCTION THEREOF

(75) Inventors: Anthony Edward Pullen, Belmont, MA (US); Thomas H. Whitesides, Somerville, MA (US); Charles H. Honeyman, Roslindale, MA (US); Barrett Comiskey, Palo Alto, CA (US); Jonathan D. Albert, Philadelphia, PA (US)

(73) Assignee: E Ink Corporation, Cambridge, MA (US)

( * ) Notice: Subject to any disclaimer, the term of this patent is extended or adjusted under 35 U.S.C. 154(b) by 41 days.

(21) Appl. No.: 10/708,130

(22) Filed: Feb. 9, 2004

(65) Prior Publication Data

US 2005/0000813 A1    Jan. 6, 2005

Related U.S. Application Data

(63) Continuation-in-part of application No. 10/063,803, filed on May 15, 2002, now Pat. No. 6,822,782, and a continuation-in-part of application No. 09/140,846, filed on Aug. 28, 1998, now Pat. No. 6,727,881.

(60) Provisional application No. 60/481,572, filed on Oct. 28, 2003, provisional application No. 60/063,803, (Continued)

(51) Int. Cl.
*G02B 26/00* (2006.01)
*G09G 3/34* (2006.01)
*G03G 17/04* (2006.01)

(52) U.S. Cl. .................. 359/296; 345/107; 430/32

(58) Field of Classification Search ............... 359/228, 359/296, 321; 106/493, 499, 502, 504; 428/402, 428/403, 405; 345/107; 252/570, 572; 505/472; 526/934; 430/32, 34, 114
See application file for complete search history.

(56) References Cited

U.S. PATENT DOCUMENTS 2,800,457 A    7/1957    Green et al. ............. 428/402.2

(Continued)

FOREIGN PATENT DOCUMENTS

DE    195 00 694    8/1996

(Continued)

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

(Continued)

*Primary Examiner*—Georgia Epps
*Assistant Examiner*—William Choi
(74) *Attorney, Agent, or Firm*—David J. Cole

(57) ABSTRACT

Copper chromite particles can advantageously be used as black particles in electrophoretic media and displays. Preferably, the copper chromite particles are coated with a silica coating and a polymer coating.

28 Claims, 3 Drawing Sheets

Related U.S. Application Data filed on May 15, 2001, provisional application No. 60/291,081, filed on May 15, 2001, provisional application No. 60/093,689, filed on Jul. 22, 1998, provisional application No. 60/092,742, filed on Jul. 14, 1998, provisional application No. 60/092,050, filed on Jul. 8, 1998, provisional application No. 60/092,046, filed on Jul. 8, 1998, provisional application No. 60/090,232, filed on Jun. 22, 1998, provisional application No. 60/090,222, filed on Jun. 22, 1998, provisional application No. 60/090,223, filed on Jun. 22, 1998, provisional application No. 60/085,096, filed on May 12, 1998, provisional application No. 60/083,252, filed on Apr. 27, 1998, provisional application No. 60/081,362, filed on Nov. 19, 1997, provisional application No. 60/081,374, filed on Apr. 10, 1998, provisional application No. 60/078,363, filed on Mar. 18, 1998, provisional application No. 60/076,978, filed on Mar. 5, 1998, provisional application No. 60/076,956, filed on Mar. 5, 1998, provisional application No. 60/076,957, filed on Mar. 5, 1998, provisional application No. 60/076,959, filed on Mar. 5, 1998, provisional application No. 60/076,955, filed on Mar. 5, 1998, provisional application No. 60/074,454, filed on Feb. 12, 1998, provisional application No. 60/070,935, filed on Jan. 9, 1998, provisional application No. 60/070,939, filed on Jan. 9, 1998, provisional application No. 60/072,390, filed on Jan. 9, 1998, provisional application No. 60/070,940, filed on Jan. 9, 1998, provisional application No. 60/071,371, filed on Jan. 15, 1998, provisional application No. 60/066,418, filed on Nov. 24, 1997, provisional application No. 60/066,334, filed on Nov. 21, 1997, provisional application No. 60/066,115, filed on Nov. 21, 1997, provisional application No. 60/066,246, filed on Nov. 20, 1997, provisional application No. 60/066,245, filed on Nov. 20, 1997, provisional application No. 60/066,147, filed on Nov. 19, 1997, provisional application No. 60/065,629, filed on Nov. 18, 1997, provisional application No. 60/065,605, filed on Nov. 18, 1997, provisional application No. 60/065,630, filed on Nov. 18, 1997, provisional application No. 60/059,358, filed on Sep. 19, 1997, provisional application No. 60/059,543, filed on Sep. 19, 1997, provisional application No. 60/057,118, filed on Aug. 28, 1997, provisional application No. 60/057,798, filed on Aug. 28, 1997, provisional application No. 60/057,122, filed on Aug. 28, 1997, provisional application No. 60/057,163, filed on Aug. 28, 1997, provisional application No. 60/057,799, filed on Aug. 28, 1997, provisional application No. 60/057,716, filed on Aug. 28, 1997, provisional application No. 60/057,133, filed on Aug. 28, 1997.

(56) References Cited

U.S. PATENT DOCUMENTS

| | | | | |
|---|---|---|---|---|
| 3,036,388 | A | 5/1962 | Tate | 434/409 |
| 3,384,488 | A | 5/1968 | Tulagin et al. | 430/32 |
| 3,406,363 | A | 10/1968 | Tate | 535/302 |
| 3,460,248 | A | 8/1969 | Tate | 29/607 |
| 3,612,758 | A | 10/1971 | Evans et al. | 348/803 |
| 3,639,133 | A | 2/1972 | Linton | 106/434 |
| 3,668,106 | A | 6/1972 | Ota | 356/305 |
| 3,670,323 | A | 6/1972 | Sobel et al. | 345/107 |
| 3,756,693 | A | 9/1973 | Ota | 345/107 |
| 3,767,392 | A | 10/1973 | Ota | 430/35 |
| 3,772,013 | A | 11/1973 | Wells | 430/34 |
| 3,792,308 | A | 2/1974 | Ota | 315/450 |
| 3,806,893 | A | 4/1974 | Ohnishi et al. | 365/153 |
| 3,850,627 | A | 11/1974 | Wells et al. | 430/34 |
| 3,870,517 | A | 3/1975 | Ota et al. | 430/38 |
| 3,884,871 | A | * 5/1975 | Herman et al. | 523/202 |
| 3,892,568 | A | 7/1975 | Ota | 430/19 |
| 4,001,140 | A | 1/1977 | Foris et al. | 427/213.34 |
| 4,041,481 | A | 8/1977 | Sato | 345/107 |
| 4,045,327 | A | 8/1977 | Noma et al. | 359/237 |
| 4,062,009 | A | 12/1977 | Raverdy et al. | 345/48 |
| 4,068,927 | A | 1/1978 | White | 359/296 |
| 4,071,430 | A | 1/1978 | Liebert | 359/241 |
| 4,088,395 | A | 5/1978 | Gigila | 359/269 |
| 4,093,534 | A | 6/1978 | Carter et al. | 359/296 |
| 4,113,362 | A | 9/1978 | Saxe et al. | 359/296 |
| 4,123,346 | A | 10/1978 | Ploix | 359/271 |
| 4,126,528 | A | 11/1978 | Chiang | 359/296 |
| 4,126,854 | A | 11/1978 | Sheridon | 345/107 |
| 4,143,103 | A | 3/1979 | Sheridon | 264/4 |
| 4,143,472 | A | 3/1979 | Murata et al. | 434/409 |
| 4,149,149 | A | 4/1979 | Miki et al. | 345/38 |
| 4,164,365 | A | 8/1979 | Saxe | 359/296 |
| 4,166,800 | A | 9/1979 | Fong | 427/212 |
| 4,203,106 | A | 5/1980 | Dalisa et al. | 345/107 |
| 4,211,668 | A | 7/1980 | Tate | 428/402.2 |
| 4,218,302 | A | 8/1980 | Dalisa et al. | 359/296 |
| 4,231,641 | A | 11/1980 | Randin | 359/274 |
| 4,261,653 | A | 4/1981 | Goodrich | 359/296 |
| 4,272,596 | A | 6/1981 | Harbour et al. | 430/37 |
| 4,273,422 | A | 6/1981 | Saxe | 359/296 |
| 4,273,672 | A | 6/1981 | Vassiliades | 264/4.1 |
| 4,285,801 | A | 8/1981 | Chiang | 252/570 |
| 4,298,448 | A | 11/1981 | Muller et al. | 359/296 |
| 4,305,807 | A | 12/1981 | Somlyody | 349/166 |
| 4,311,361 | A | 1/1982 | Somlyody | 359/296 |
| 4,314,013 | A | 2/1982 | Chang | 430/37 |
| 4,324,456 | A | 4/1982 | Dalisa | 359/296 |
| 4,368,952 | A | 1/1983 | Murata et al. | 359/296 |
| 4,390,403 | A | 6/1983 | Batchelder | 204/547 |
| 4,418,346 | A | 11/1983 | Batchelder | 345/107 |
| 4,419,383 | A | 12/1983 | Lee | 427/550 |
| 4,419,663 | A | 12/1983 | Kohashi | 345/107 |
| 4,438,160 | A | 3/1984 | Ishikawa et al. | 427/214 |
| 4,450,440 | A | 5/1984 | White | 345/35 |
| 4,476,210 | A | 10/1984 | Croucher et al. | 430/114 |
| 4,502,934 | A | 3/1985 | Gazard et al. | 204/242 |
| 4,522,472 | A | 6/1985 | Liebert et al. | 359/296 |
| 4,530,961 | A | 7/1985 | Nguyen et al. | 524/832 |
| 4,543,306 | A | 9/1985 | Dubois et al. | 429/337 |
| 4,594,271 | A | 6/1986 | Scholten et al. | 427/221 |
| 4,620,916 | A | 11/1986 | Zwemer et al. | 359/296 |
| 4,639,403 | A | 1/1987 | Podszun et al. | 436/115 |
| 4,643,528 | A | 2/1987 | Bell, Jr. | 349/166 |
| 4,648,956 | A | 3/1987 | Marshall et al. | 359/296 |
| 4,655,897 | A | 4/1987 | DiSanto et al. | 359/296 |
| 4,661,408 | A | 4/1987 | Lau et al. | 428/405 |
| 4,665,107 | A | 5/1987 | Micale | 523/105 |
| 4,680,103 | A | 7/1987 | Beilin et al. | 359/296 |
| 4,690,749 | A | 9/1987 | Van Alstine et al. | 204/454 |
| 4,707,080 | A | 11/1987 | Fergason | 349/89 |
| 4,726,662 | A | 2/1988 | Cromack | 349/57 |
| 4,732,830 | A | 3/1988 | DiSanto et al. | 430/20 |
| 4,742,345 | A | 5/1988 | DiSanto et al. | 345/107 |
| 4,746,917 | A | 5/1988 | DiSanto et al. | 345/107 |
| 4,748,366 | A | 5/1988 | Taylor | 310/328 |
| 4,772,102 | A | 9/1988 | Fergason et al. | 349/86 |
| 4,772,103 | A | 9/1988 | Saxe | 359/296 |
| 4,776,675 | A | 10/1988 | Takaochi et al. | 349/106 |
| 4,810,305 | A | 3/1989 | Braun et al. | 106/499 |
| 4,824,208 | A | 4/1989 | Fergason et al. | 349/601 |
| 4,832,458 | A | 5/1989 | Fergason et al. | 349/56 |

| Patent No. | Date | Inventor | Class |
|---|---|---|---|
| 4,833,464 A | 5/1989 | DiSanto et al. | 345/107 |
| 4,846,893 A | 7/1989 | Akasaki et al. | 106/500 |
| 4,877,698 A | 10/1989 | Watson et al. | 430/45 |
| 4,888,309 A | 12/1989 | Araya | 501/80 |
| 4,889,603 A | 12/1989 | DiSanto et al. | 95/30 |
| 4,891,245 A | 1/1990 | Micale | 427/213.3 |
| 4,892,607 A | 1/1990 | DiSanto et al. | 156/275.7 |
| 4,902,570 A | 2/1990 | Heinemann et al. | 428/405 |
| 4,909,959 A | 3/1990 | Lemaire et al. | 252/500 |
| 4,919,521 A | 4/1990 | Tada et al. | 359/296 |
| 4,931,019 A | 6/1990 | Park | 434/409 |
| 4,946,509 A | 8/1990 | Schwartz et al. | 106/496 |
| 4,947,219 A | 8/1990 | Boehm | 257/471 |
| 4,985,329 A | 1/1991 | El-Sayed et al. | 430/115 |
| 5,009,490 A | 4/1991 | Kuono et al. | 349/25 |
| 5,017,225 A | 5/1991 | Nakanishi et al. | 106/31.21 |
| 5,041,824 A | 8/1991 | DiSanto et al. | 345/107 |
| 5,053,763 A | 10/1991 | DiSanto et al. | 345/107 |
| 5,057,363 A | 10/1991 | Nakanishi | 482/321.5 |
| 5,059,694 A | 10/1991 | Delabouglise et al. | 548/518 |
| 5,066,105 A | 11/1991 | Yoshimoto et al. | 349/53 |
| 5,066,559 A | 11/1991 | Elmasry et al. | 430/115 |
| 5,066,946 A | 11/1991 | DiSanto et al. | 345/107 |
| 5,070,326 A | 12/1991 | Yoshimoto et al. | 349/53 |
| 5,077,157 A | 12/1991 | DiSanto et al. | 430/20 |
| 5,082,351 A | 1/1992 | Fergason | 349/86 |
| 5,105,185 A | 4/1992 | Nakanowatari et al. | 348/94 |
| 5,119,218 A | 6/1992 | Yoshimoto et al. | 349/41 |
| 5,128,785 A | 7/1992 | Yoshimoto et al. | 349/53 |
| 5,132,049 A | 7/1992 | Garreau et al. | 252/500 |
| 5,138,472 A | 8/1992 | Jones et al. | 349/166 |
| 5,149,826 A | 9/1992 | Delabouglise et al. | 548/518 |
| 5,151,032 A | 9/1992 | Igawa | 434/409 |
| 5,174,882 A | 12/1992 | DiSanto et al. | 359/238 |
| 5,177,476 A | 1/1993 | DiSanto et al. | 345/107 |
| 5,185,226 A | 2/1993 | Grosso et al. | 430/47 |
| 5,187,609 A | 2/1993 | DiSanto et al. | 359/296 |
| 5,204,424 A | 4/1993 | Roncali et al. | 526/256 |
| 5,213,983 A | 5/1993 | Gustafsson et al. | 438/82 |
| 5,216,416 A | 6/1993 | DiSanto et al. | 345/107 |
| 5,223,115 A | 6/1993 | DiSanto et al. | 359/238 |
| 5,223,823 A | 6/1993 | DiSanto et al. | 345/107 |
| 5,247,290 A | 9/1993 | DiSanto et al. | 345/107 |
| 5,250,932 A | 10/1993 | Yoshimoto et al. | 349/53 |
| 5,250,938 A | 10/1993 | DiSanto et al. | 345/107 |
| 5,254,981 A | 10/1993 | DiSanto et al. | 345/107 |
| 5,262,098 A | 11/1993 | Crowley et al. | 264/8 |
| 5,266,937 A | 11/1993 | DiSanto et al. | 345/107 |
| 5,268,448 A | 12/1993 | Buechner et al. | 526/380 |
| 5,270,843 A | 12/1993 | Wang | 349/90 |
| 5,276,438 A | 1/1994 | DiSanto et al. | 345/107 |
| 5,279,511 A | 1/1994 | DiSanto et al. | 445/24 |
| 5,279,694 A | 1/1994 | DiSanto et al. | 156/275.5 |
| 5,279,773 A | 1/1994 | Saxe | 252/585 |
| 5,281,261 A | 1/1994 | Lin | 106/31.65 |
| 5,293,528 A | 3/1994 | DiSanto et al. | 345/107 |
| 5,296,974 A | 3/1994 | Tada et al. | 359/885 |
| 5,298,833 A | 3/1994 | Hou | 313/483 |
| 5,302,235 A | 4/1994 | DiSanto et al. | 216/5 |
| 5,303,073 A | 4/1994 | Shirota et al. | 349/74 |
| 5,304,439 A | 4/1994 | DiSanto et al. | 430/20 |
| 5,315,312 A | 5/1994 | DiSanto et al. | 345/107 |
| 5,344,594 A | 9/1994 | Sheridon | 264/4.1 |
| 5,359,346 A | 10/1994 | DiSanto et al. | 345/107 |
| 5,360,689 A | 11/1994 | Hou et al. | 430/34 |
| 5,380,362 A | 1/1995 | Schubert | 106/493 |
| 5,383,008 A | 1/1995 | Sheridon | 399/156 |
| 5,389,945 A | 2/1995 | Sheridon | 345/85 |
| 5,402,145 A | 3/1995 | DiSanto et al. | 345/107 |
| 5,403,518 A | 4/1995 | Schubert | 252/572 |
| 5,411,398 A | 5/1995 | Nakanishi et al. | 434/409 |
| 5,411,656 A | 5/1995 | Schubert | 345/107 |
| 5,421,926 A | 6/1995 | Yukinobu et al. | 156/83 |
| 5,463,492 A | 10/1995 | Check, III | 359/296 |
| 5,467,107 A | 11/1995 | DiSanto et al. | 345/107 |
| 5,467,217 A | 11/1995 | Check, III | 359/296 |
| 5,498,674 A | 3/1996 | Hou et al. | 525/369 |
| 5,508,068 A | 4/1996 | Nakano | 427/553 |
| 5,512,162 A | 4/1996 | Sachs et al. | 205/91 |
| 5,543,219 A | 8/1996 | Elwakil | 428/402.24 |
| 5,545,504 A | 8/1996 | Keoshkerian et al. | 430/137.17 |
| 5,552,679 A | 9/1996 | Murasko | 315/169.3 |
| 5,554,739 A | 9/1996 | Belmont | 539/885 |
| 5,556,583 A | 9/1996 | Tashiro et al. | 264/4.1 |
| 5,561,443 A | 10/1996 | DiSanto et al. | 345/107 |
| 5,565,885 A | 10/1996 | Tamanoi | 345/100 |
| 5,571,311 A | 11/1996 | Belmont et al. | 106/31.28 |
| 5,573,711 A | 11/1996 | Hou et al. | 252/572 |
| 5,575,845 A | 11/1996 | Belmont et al. | 106/712 |
| 5,582,700 A | 12/1996 | Bryning et al. | 204/450 |
| 5,597,889 A | 1/1997 | Takimoto et al. | 427/58 |
| 5,604,027 A | 2/1997 | Sheridon | 428/323 |
| 5,604,070 A | 2/1997 | Rao et al. | 430/108.22 |
| 5,610,455 A | 3/1997 | Allen et al. | 307/400 |
| 5,614,340 A | 3/1997 | Bugner et al. | 430/41 |
| 5,627,561 A | 5/1997 | Laspina et al. | 345/107 |
| 5,635,317 A | 6/1997 | Taniguchi et al. | 430/7 |
| 5,638,103 A | 6/1997 | Obata et al. | 347/164 |
| 5,639,914 A | 6/1997 | Tomiyama et al. | 564/309 |
| 5,643,673 A | 7/1997 | Hou | 428/402.24 |
| 5,650,872 A | 7/1997 | Saxe et al. | 359/296 |
| 5,654,367 A | 8/1997 | Takimoto et al. | 525/178 |
| 5,663,224 A | 9/1997 | Emmons et al. | 524/188 |
| 5,672,198 A | 9/1997 | Belmont | 106/31.75 |
| 5,672,381 A | 9/1997 | Rajan | 427/198 |
| 5,673,148 A | 9/1997 | Morris et al. | 359/536 |
| 5,676,884 A | 10/1997 | Tiers et al. | 252/582 |
| 5,689,282 A | 11/1997 | Wolfs et al. | 345/100 |
| 5,691,098 A | 11/1997 | Busman et al. | 430/158 |
| 5,693,442 A | 12/1997 | Weiss et al. | 430/66 |
| 5,694,224 A | 12/1997 | Tai | 358/3.01 |
| 5,698,016 A | 12/1997 | Adams et al. | 106/31.6 |
| 5,707,432 A | 1/1998 | Adams et al. | 106/316 |
| 5,707,738 A | 1/1998 | Hou | 428/402 |
| 5,707,747 A | 1/1998 | Tomiyama et al. | 428/457 |
| 5,708,525 A | 1/1998 | Sheridon | 359/296 |
| 5,709,976 A | 1/1998 | Malhotra | 428/32.11 |
| 5,713,988 A | 2/1998 | Belmont et al. | 106/31.6 |
| 5,714,270 A | 2/1998 | Malhotra et al. | 428/32.11 |
| 5,714,993 A | 2/1998 | Keoshkerian et al. | 347/95 |
| 5,715,511 A | 2/1998 | Aslam et al. | 399/320 |
| 5,716,550 A | 2/1998 | Gardner et al. | 252/500 |
| 5,717,283 A | 2/1998 | Biegelsen et al. | 313/483 |
| 5,717,514 A | 2/1998 | Sheridon | 359/296 |
| 5,717,515 A | 2/1998 | Sheridon | 359/296 |
| 5,725,935 A | 3/1998 | Rajan | 428/195.1 |
| 5,729,632 A | 3/1998 | Tai | 382/237 |
| 5,737,115 A | 4/1998 | Mackinlay et al. | 359/296 |
| 5,739,801 A | 4/1998 | Sheridon | 345/84 |
| 5,740,495 A | 4/1998 | Maher et al. | 399/71 |
| 5,744,283 A | 4/1998 | Spierings et al. | 430/313 |
| 5,745,094 A | 4/1998 | Gordon, II et al. | 345/107 |
| 5,747,562 A | 5/1998 | Mahmud et al. | 523/215 |
| 5,751,268 A | 5/1998 | Sheridon | 345/107 |
| 5,753,763 A | 5/1998 | Rao et al. | 525/276 |
| 5,754,332 A | 5/1998 | Crowley | 359/296 |
| 5,759,671 A | 6/1998 | Tanaka et al. | 428/166 |
| 5,760,761 A | 6/1998 | Sheridon | 345/107 |
| 5,763,548 A | 6/1998 | Matyjaszewski et al. | 526/135 |
| 5,767,826 A | 6/1998 | Sheridon et al. | 345/84 |
| 5,777,782 A | 7/1998 | Sheridon | 359/296 |
| 5,783,614 A | 7/1998 | Chen et al. | 523/705 |
| 5,789,487 A | 8/1998 | Matyjaszewski et al. | 525/301 |
| 5,803,959 A | 9/1998 | Johnson et al. | 106/31.75 |
| 5,807,937 A | 9/1998 | Matyjaszewski et al. | 526/135 |
| 5,808,783 A | 9/1998 | Crowley | 359/296 |

| | | | |
|---|---|---|---|
| 5,825,529 A | 10/1998 | Crowley | 359/296 |
| 5,828,432 A | 10/1998 | Shashidhar et al. | 349/139 |
| 5,837,045 A | 11/1998 | Johnson et al. | 106/31.85 |
| 5,843,259 A | 12/1998 | Narang et al. | 156/151 |
| 5,851,280 A | 12/1998 | Belmont et al. | 106/472 |
| 5,872,552 A | 2/1999 | Gordon, II et al. | 345/107 |
| 5,885,335 A | 3/1999 | Adams et al. | 106/31.6 |
| 5,895,522 A | 4/1999 | Belmont et al. | 106/31.6 |
| 5,900,858 A | 5/1999 | Richley | 345/107 |
| 5,914,806 A | 6/1999 | Gordon II et al. | 359/296 |
| 5,922,118 A | 7/1999 | Johnson et al. | 106/31.6 |
| 5,930,026 A | 7/1999 | Jacobson et al. | 359/296 |
| 5,932,633 A | 8/1999 | Chen et al. | 523/205 |
| 5,945,491 A | 8/1999 | Matyjaszewski et al. | 526/111 |
| 5,958,999 A | 9/1999 | Bates et al. | 523/161 |
| 5,961,804 A | 10/1999 | Jacobson et al. | 204/606 |
| 5,964,935 A | 10/1999 | Chen et al. | 106/401 |
| 5,968,243 A | 10/1999 | Belmont et al. | 106/31.65 |
| 5,986,015 A | 11/1999 | Midha et al. | 525/370 |
| H1828 H | 1/2000 | Wong et al. | 523/161 |
| 6,017,584 A | 1/2000 | Albert et al. | 427/213.3 |
| 6,025,896 A | 2/2000 | Hattori et al. | 349/86 |
| 6,054,071 A | 4/2000 | Mikkelsen, Jr. | 264/1.36 |
| 6,055,091 A | 4/2000 | Sheridon et al. | 359/296 |
| 6,055,180 A | 4/2000 | Gudesen et al. | 365/175 |
| 6,064,784 A | 5/2000 | Whitehead et al. | 385/18 |
| 6,067,185 A | 5/2000 | Albert et al. | 359/296 |
| 6,068,688 A | 5/2000 | Whitehouse et al. | 106/31.65 |
| 6,069,205 A | 5/2000 | Wang | 525/242 |
| 6,071,980 A | 6/2000 | Guan et al. | 522/66 |
| 6,091,382 A | 7/2000 | Shioya et al. | 345/76 |
| 6,097,531 A | 8/2000 | Sheridon | 359/296 |
| 6,103,380 A | 8/2000 | Devonport | 428/403 |
| 6,111,022 A | 8/2000 | Matyjaszewski et al. | 525/238 |
| 6,113,810 A | 9/2000 | Hou et al. | 252/572 |
| 6,117,368 A | 9/2000 | Hou | 252/572 |
| 6,118,426 A | 9/2000 | Albert et al. | 345/107 |
| 6,120,588 A | 9/2000 | Jacobson | 106/31.16 |
| 6,120,839 A | 9/2000 | Comiskey et al. | 427/213.3 |
| 6,121,371 A | 9/2000 | Matyjaszewski et al. | 529/804 |
| 6,124,411 A | 9/2000 | Matyjaszewski et al. | 526/111 |
| 6,124,851 A | 9/2000 | Jacobson | 345/206 |
| 6,128,124 A | 10/2000 | Silverman | 359/296 |
| 6,130,773 A | 10/2000 | Jacobson et al. | 359/296 |
| 6,130,774 A | 10/2000 | Albert et al. | 359/296 |
| 6,137,012 A | 10/2000 | Fagan et al. | 568/12 |
| 6,137,467 A | 10/2000 | Sheridon et al. | 345/107 |
| 6,144,361 A | 11/2000 | Gordon, II et al. | 345/107 |
| 6,147,791 A | 11/2000 | Sheridon | 359/296 |
| 6,153,705 A | 11/2000 | Corpart et al. | 525/244 |
| 6,162,882 A | 12/2000 | Matyjaszewski et al. | 526/111 |
| 6,172,798 B1 | 1/2001 | Albert et al. | 359/296 |
| 6,177,921 B1 | 1/2001 | Comiskey et al. | 345/107 |
| 6,184,856 B1 | 2/2001 | Gordon, II et al. | 345/107 |
| 6,191,225 B1 | 2/2001 | Barkac et al. | 525/208 |
| 6,197,883 B1 | 3/2001 | Schimmel et al. | 525/111 |
| 6,215,920 B1 | 4/2001 | Whitehead et al. | 385/18 |
| 6,221,143 B1 | 4/2001 | Palumbo | 106/31.6 |
| 6,225,971 B1 | 5/2001 | Gordon, II et al. | 345/107 |
| 6,232,950 B1 | 5/2001 | Albert et al. | 345/107 |
| 6,235,829 B1 | 5/2001 | Kwan | 524/495 |
| 6,241,921 B1 | 6/2001 | Jacobson et al. | 264/136 |
| 6,249,271 B1 | 6/2001 | Albert et al. | 345/107 |
| 6,252,564 B1 | 6/2001 | Albert et al. | 345/1.3 |
| 6,262,706 B1 | 7/2001 | Albert et al. | 345/107 |
| 6,262,833 B1 | 7/2001 | Loxley et al. | 359/296 |
| 6,271,823 B1 | 8/2001 | Gordon, II et al. | 345/107 |
| 6,300,932 B1 | 10/2001 | Albert | 345/107 |
| 6,301,038 B1 | 10/2001 | Fitzmaurice et al. | 359/265 |
| 6,312,304 B1 | 11/2001 | Duthaler et al. | 711/141 |
| 6,312,971 B1 | 11/2001 | Amundson et al. | 438/99 |
| 6,323,989 B1 | 11/2001 | Jacobson et al. | 359/296 |
| 6,327,072 B1 | 12/2001 | Comiskey et al. | 359/296 |
| 6,376,828 B1 | 4/2002 | Comiskey | 250/216 |
| 6,377,387 B1 | 4/2002 | Duthaler et al. | 359/296 |
| 6,392,785 B1 | 5/2002 | Albert et al. | 359/296 |
| 6,392,786 B1 | 5/2002 | Albert | 359/296 |
| 6,398,858 B1 | 6/2002 | Yu et al. | 106/31.64 |
| 6,413,790 B1 | 7/2002 | Duthaler et al. | 438/21 |
| 6,422,687 B1 | 7/2002 | Jacobson | 347/55 |
| 6,445,374 B1 | 9/2002 | Albert et al. | 345/107 |
| 6,445,489 B1 | 9/2002 | Jacobson et al. | 359/296 |
| 6,459,418 B1 | 10/2002 | Comiskey et al. | 345/107 |
| 6,473,072 B1 | 10/2002 | Comiskey et al. | 345/173 |
| 6,480,182 B1 | 11/2002 | Turner et al. | 345/107 |
| 6,498,114 B1 | 12/2002 | Amundson et al. | 438/780 |
| 6,504,524 B1 | 1/2003 | Gates et al. | 345/107 |
| 6,506,438 B1 | 1/2003 | Duthaler et al. | 427/58 |
| 6,512,354 B1 | 1/2003 | Jacobson et al. | 324/71.1 |
| 6,515,649 B1 | 2/2003 | Albert et al. | 345/107 |
| 6,518,949 B1 | 2/2003 | Drzaic | 345/107 |
| 6,521,489 B1 | 2/2003 | Duthaler et al. | 438/149 |
| 6,531,997 B1 | 3/2003 | Gates et al. | 345/107 |
| 6,535,197 B1 | 3/2003 | Comiskey et al. | 345/107 |
| 6,538,801 B1 | 3/2003 | Jacobson et al. | 359/296 |
| 6,545,291 B1 | 4/2003 | Amundson et al. | 257/40 |
| 6,580,545 B1 | 6/2003 | Morrison et al. | 359/265 |
| 6,582,814 B1 * | 6/2003 | Swiler et al. | 428/328 |
| 6,639,578 B1 | 10/2003 | Comiskey et al. | 345/107 |
| 6,657,772 B1 | 12/2003 | Loxley | 359/296 |
| 6,664,944 B1 | 12/2003 | Albert et al. | 345/107 |
| 6,672,921 B1 | 1/2004 | Liang et al. | 445/24 |
| 6,680,725 B1 | 1/2004 | Jacobson | 345/107 |
| 6,683,333 B1 | 1/2004 | Kazlas et al. | 257/197 |
| 6,693,620 B1 | 2/2004 | Herb et al. | 345/107 |
| 6,704,133 B1 | 3/2004 | Gates et al. | 359/296 |
| 6,710,540 B1 | 3/2004 | Albert et al. | 313/498 |
| 6,721,083 B1 | 4/2004 | Jacobson et al. | 359/296 |
| 6,724,519 B1 | 4/2004 | Comiskey et al. | 359/296 |
| 6,727,881 B1 | 4/2004 | Albert et al. | 345/107 |
| 6,753,999 B1 | 6/2004 | Zehner et al. | 359/296 |
| 6,788,449 B1 | 9/2004 | Liang et al. | 359/296 |
| 6,816,147 B1 | 11/2004 | Albert | 345/107 |
| 6,819,471 B1 | 11/2004 | Amundson et al. | 359/296 |
| 6,822,782 B1 | 11/2004 | Honeyman et al. | 359/296 |
| 6,825,068 B1 | 11/2004 | Denis et al. | 438/149 |
| 6,825,829 B1 | 11/2004 | Albert et al. | 345/107 |
| 6,825,970 B1 | 11/2004 | Goenaga et al. | 359/296 |
| 6,831,769 B1 | 12/2004 | Holman et al. | 359/296 |
| 6,839,158 B1 | 1/2005 | Albert et al. | 359/296 |
| 6,842,167 B1 | 1/2005 | Albert et al. | 345/107 |
| 6,842,657 B1 | 1/2005 | Drzaic et al. | 700/120 |
| 6,864,875 B1 | 3/2005 | Drzaic et al. | 345/107 |
| 6,865,010 B1 | 3/2005 | Duthaler et al. | 359/296 |
| 6,866,760 B1 | 3/2005 | Paolini Jr. et al. | 204/478 |
| 6,870,661 B1 | 3/2005 | Pullen et al. | 359/296 |
| 2002/0060321 A1 | 5/2002 | Kazlas et al. | 257/66 |
| 2002/0063661 A1 | 5/2002 | Comiskey et al. | 345/55 |
| 2002/0090980 A1 | 7/2002 | Wilcox et al. | 455/566 |
| 2002/0113770 A1 | 8/2002 | Jacobson et al. | 345/107 |
| 2002/0130832 A1 | 9/2002 | Baucom et al. | 345/107 |
| 2002/0180687 A1 | 12/2002 | Webber | 345/107 |
| 2003/0011560 A1 | 1/2003 | Albert et al. | 345/107 |
| 2003/0020844 A1 | 1/2003 | Albert et al. | 349/33 |
| 2003/0102858 A1 | 6/2003 | Jacobson et al. | 324/158.1 |
| 2003/0132908 A1 | 7/2003 | Herb et al. | 345/107 |
| 2003/0137521 A1 | 7/2003 | Zehner et al. | 345/589 |
| 2003/0151702 A1 | 8/2003 | Morrison et al. | 349/25 |
| 2003/0214695 A1 | 11/2003 | Abramson et al. | 359/265 |
| 2003/0222315 A1 | 12/2003 | Amundson et al. | 257/368 |
| 2004/0027327 A1 | 2/2004 | LeCain et al. | 345/107 |
| 2004/0119681 A1 | 6/2004 | Albert et al. | 345/107 |
| 2005/0035941 A1 | 2/2005 | Albert et al. | 345/107 |

FOREIGN PATENT DOCUMENTS

| | | |
|---|---|---|
| EP | 0 281 204 A2 | 9/1988 |
| EP | 0 404 545 A2 | 12/1990 |
| EP | 0 443 571 A2 | 8/1991 |
| EP | 1 145 072 B1 | 5/2003 |
| GB | 1314906 | 4/1973 |
| GB | 1465701 | 3/1977 |
| GB | 2 306 229 A | 4/1997 |
| JP | 51-130241 A | 11/1976 |
| JP | 53-073098 | 6/1978 |
| JP | 54-111368 A | 8/1979 |
| JP | 55-096922 A | 7/1980 |
| JP | 55-105227 A | 8/1980 |
| JP | 59-0988227 A | 6/1984 |
| JP | 59-165028 A | 9/1984 |
| JP | 60-189731 A | 9/1985 |
| JP | 62-0588222 A | 3/1987 |
| JP | 62-183439 A | 8/1987 |
| JP | 62-231930 A | 10/1987 |
| JP | 62-269124 A | 11/1987 |
| JP | 62-299824 A | 12/1987 |
| JP | 63-008637 A | 1/1988 |
| JP | 01-086117 A | 3/1989 |
| JP | 64-86116 | 3/1989 |
| JP | 64-086118 | 3/1989 |
| JP | 01-114829 A | 5/1989 |
| JP | 01-142537 A | 6/1989 |
| JP | 01-177517 A | 7/1989 |
| JP | 01-248182 A | 10/1989 |
| JP | 01-267525 A | 10/1989 |
| JP | 02-024633 A | 1/1990 |
| JP | 02-141730 A | 5/1990 |
| JP | 02-189525 A | 7/1990 |
| JP | 02-223934 A | 9/1990 |
| JP | 02-223935 A | 9/1990 |
| JP | 02-223936 A | 9/1990 |
| JP | 02-284124 A | 11/1990 |
| JP | 02-284125 A | 11/1990 |
| JP | 03-258866 A | 11/1991 |
| JP | 05-061421 A | 3/1993 |
| JP | 05-165064 A | 6/1993 |
| JP | 05-173193 A | 7/1993 |
| JP | 05-173194 A | 7/1993 |
| JP | 05-307197 A | 11/1993 |
| JP | 06-089081 A | 3/1994 |
| JP | 06-202168 A | 7/1994 |
| JP | 07-036020 A | 2/1995 |
| JP | 07-146660 A | 6/1995 |
| JP | 08-234176 A | 9/1996 |
| JP | 09-006277 A | 1/1997 |
| JP | 09-185087 A | 7/1997 |
| JP | 09-230391 A | 9/1997 |
| JP | 10-048673 A | 2/1998 |
| JP | 10-149118 A | 6/1998 |
| JP | 10-161161 A | 6/1998 |
| JP | 2000-066248 | 3/2000 |
| JP | 2000-227612 | 8/2000 |
| WO | WO 82/02961 | 9/1982 |
| WO | WO 95/33085 | 12/1995 |
| WO | WO 99/12170 | 3/1999 |
| WO | WO 99/26419 | 5/1999 |
| WO | WO 99/51690 | 10/1999 |
| WO | WO 00/05312 | 2/2000 |
| WO | WO 00/05704 | 2/2000 |
| WO | WO 00/22051 | 4/2000 |
| WO | WO 00/36560 | 6/2000 |
| WO | WO 00/38000 | 6/2000 |
| WO | WO 00/67110 | 11/2000 |
| WO | WO 00/67327 | 11/2000 |
| WO | WO 01/07961 | 2/2001 |
| WO | WO 01/27690 | 4/2001 |
| WO | WO 01/92359 | 12/2001 |
| WO | WO 02/21201 | 3/2002 |
| WO | WO 03/107315 | 12/2003 |

OTHER PUBLICATIONS

Bach, U., et al., "Nanomaterials-Based Electrochromics for Paper-Quality Displays", Adv. Mater, 14(11), 845 (2002).

Ballinger, D.O., "Magnetic recording paper is erasable", Electronics, Mar. 1, 1973, pp. 73-76.

Beers, K. L., et al., "Atom Transfer Radical Polymerization of 2-Hydroxyethyl Methacrylate", Macromolecules, 32, 5772-5776 (1999).

Beilin, S., et al, "2000-Character Electrophoretic Display", SID 86 Digest, 136 (1986).

Bohnke et al., "Polymer-Based Solid Electrochromic Cell for Matrix-Addressable Display Devices." J. Electrochem. Soc., 138, 3612 (1991).

Boston Herald, "E Ink debuts in J.C. Penney Stores", May 3, 1999, p. 27.

Bryce, M.R., "Seeing through synthetic metals", Nature, 335. 12 (1988).

Chen, Y., et al., "A Conformable Electronic Ink Display using a Foil-Based a-Si TFT Array", SID 01 Digest, 157 (Jun. 2001).

Chiang, A., "Conduction Mechanism of Charge Control Agents Used in Electrophoretic Display Devices", Proceeding of the S.I.D., 18, 275 (1977).

Chiang, A., et al., "A High Speed Electrophoretic Matrix Display", SID 80 Digest (1980), 114.

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Croucher, M.D., et al., "Electrophoretic Display: Materials as Related to Performance", Photog. Sci. Eng., 25, 80 (1981).

Dalisa, A.L., "Electrophoretic Display Technology", IEEE Trans. Electron Dev., ED-24, 827 (1977).

Drzaic, P., et al., "A Printed and Rollable Bistable Electronic Display", SID 98 Digest (1998), p. 1131.

Egashira, N., et al., "Solid electrochromic cell consisting of Lu-diphthalocyanine and lead fluoride", Proceedings of the SID, 28, 227 (1987).

Fitzhenry, B., "Identification of a Charging Mechanism using Infrared Spectroscopy", Appl. Spectroscopy, 33, 107 (1979).

Fitzhenry, B., "Optical effects of adsorption of dyes on pigment used in electrophoretic image displays", Appl. Optics., 18, 3332 (1979).

Goodman, L.A., Passive Liquid Displays: Liquid Crystals, Electrophoretics and Electrochromics, Proceedings of S.I.D., 17, 30 (1976).

Gutcho, M.H., Microcapsules and Microencapsulation Techniques, Noyes Data Corp., Park Ridge NJ, (1976).

Hatano, T., et al., "18:3: Bistable Paper-White Display Device Using Cholesteric Liquid Crystals", SID 96 Digest, 269 (1996).

Hou, J., et al., "Active Matrix Electrophoretic Displays Containing Black and White Particles with Opposite Polarities", SID 01 Digest, 164 (Jun. 2001).

Jacobson, J., "The last book", IBM Systems J., 36, 457 (1997).

Ji, Y., et al., "P-50: Polymer Walls in Higher-Polymer-Content Bistable Reflective Cholesteric Displays", SID 96 Digest, 611 (1996).

Jin et al., "Optically Transparent, Electrically Conductive Composite Medium", Science, 255, 446 (1992).

Jo, G-R, et al., "Toner Display Based on Particle Movements", Chem. Mater, 14, 664 (2002).

Kazlas, P., et al., "12.1" SVGA Microencapsulated Electrophoretic Active Matrix Display for Information Applicances, SID 01 Digest, 152 (Jun. 2001).

Kitamura, T., et al., "Electrical toner movement for electronic paper-like display" Asia Display/IDW '01, p. 1517, Paper HCS1-1 (2001).

Lee, L.L., "Fabrication of Magnetic Particles Displays", Proceedings of the SID, 18, 283 (1977).

Lewis et al., "Gravitational, Inter-Particle and Particle-Electrode Forces in the Electrophoretic Display", Proceedings of the SID, 18, 235 (1977).

Milner, "Polymer Brushes", Science, 251, 905 (1991).

Murau, P., et al., "An Electrophoretic Radiographic Device", SID 79 Digest, (1979) pp. 46-47.

Murau, P., et al., "The understanding and elimination of some suspension instabilities in an electrophoretic display", J. Appl. Phys., 49, 4820 (1978).

Negroponte, N., et al., "Surfaces and Displays," Wired, Jan. 1997, p. 212.

O'Regan, B. et al., "A Low Cost, High-efficiency Solar Cell Based on Dye-sensitized colloidal $TiO_2$ Films", Nature, vol. 353, Oct. 24, 1991, 773-740.

Ota, I., et al, "Developments in Electrophoretic Displays", Proceedings of the SID, 18, 243 (1977).

Ota, I., et al., "Electrophoretic display devices", Laser 75 Optoelectronics Conference Proceedings, 145 (1975).

Ota, I., et al., "Electrophoretic Image Display (EPID) Panel", Proceedings of the IEEE, 61, 832 (1973).

Pankove, "Color Reflection Type Display Panel", RCA Technical Notes, Mar. 1962, No. 535.

Pansu, B., et al., "Structures of Thin Layers of Hard Spheres: High Pressure Limit," J. Physique, 45, 331 (1984).

Pansu, B., et al., "Thin colloidal crystals: a series of structural transitions," J. Physique, 44, 531 (1983).

Pearlstein, "Electroless Plating", in Lowenheim (ed.), Modern Electroplating, Wiley, New York (1976), pp. 710-747.

Peiranski, P., et al., "Thin Colloidal Crystals," Phys. Rev. Lett., 50, 900 (1983).

Peterson, I., "Rethinking Ink Printing the Pages of an Electronic Book," Science News, 153, 396 (Jun. 20, 1998).

Platt, C., "Digital Ink," Wired, May 1997, p. 162.

Saitoh, M., et al., "A newly developed electrical twisting ball display", Proceedings of the SID, 23, 249 (1982).

Sankus, "Electrophoretic Display Cell", Xerox Disclosure Journal, 6(3), 309 (1979).

Sheridon, N.K., et al., "A Photoconductor-Addressed Electrophoretic Cell for Office Data Display", SID 82 Digest, 94 (1982).

Shiffman, R.R., et al., "An Electrophoretic Image Display with Internal NMOS Address Logic and Display Drivers," Proceedings of the SID, 1984, vol. 25, 105 (1984).

Shiwa, S., et al., "Electrophoretic Display Method Using Ionographic Technology," SID 88 Digest (1988), p. 61.

Singer, B., et al., "An X-Y Addressable Electrophoretic Display," Proceedings of the SID, 18, 255 (1977).

Tsubokawa, N., et al., "Polymerization of vinyl monomers in the presence of silica having surface functional groups", Colloid. Polym. Sci., 271, 940 (1993).

Van Winkle, D.H., et al., "Layering Transitions in Colloidal Crystals as Observed by Diffraction and Direct-Lattice Imaging", Phys. Rev. A, 34, 562 (1986).

Vance, D.W., "Optical Characteristics of Electroporetic Displays", Proceedings of the SID, 18, 267 (1977).

Vandegaer, J.E. (ed.), "Microencapsulation Processes and Applications", pp. v-x, 1-180 (Plenum Press, New York 1974).

Vaz, N.A., et al., "Dual-frequency addressing of polymer-dispersed liquid-crystal films", J. Appl. Phys. 65, 5043 (1989).

Wang, J.S. et al., "Controlled/'Living' Radical Polymerization. Atom Transfer Radical Polymerization in the Presence of Transition-Metal Complexes", J. Am. Chem. Soc., 117, 5614 (1995).

Wang, J-S, et al., "Controlled/'Living' Radical Polymerization. Halogen Atom Transfer Radical Polymerization Promoted by a Cu(I)CU(II) Redox Process", Macromolecules 1995, 28, 7901-7910.

White, R., "An Electrophoretic Bar Graph Display," Proceedings of the SID, 22, 173 (1981).

Wood, D., "An Electrochromic Renaissance?" Information Display, 18(3), (Mar. 2002).

Yamaguchi, Y., et al., "Toner display using insulative particles charged triboelectrically", Asia Display/IDW '01, p. 1729, Paper AMD4-4 (2001).

Yang, Y., et al., "A new architecture for polymer transistors", Nature, 372, 344 (1994).

Zollinger, "Structures of Simple Di-Triarylmethine Dyes", in Color Chemistry: Syntheses, Properties and Applications of Organic Dyes and Pigments, 2nd Rev. Edition, VCH, Weinheim, p. 73 (1991).

Zurer, P., "Digital Ink Brings Electronic Books Closer," Chemical and Engineering News, Jul. 20, 1998, p. 12.

* cited by examiner

ELECTROPHORETIC PARTICLES, AND PROCESSES FOR THE PRODUCTION THEREOF

CROSS REFERENCE TO RELATED APPLICATIONS

This application is a continuation-in-part of application Ser. No. 09/140,846, filed Aug. 28, 1998 (now U.S. Pat. No. 6,727,881), which in turn claims benefit of (1) application Ser. No. 60/057,133, filed Aug. 28, 1997; (2) application Ser. No. 60/057,716, filed Aug. 28, 1997; (3) application Ser. No. 60/057,799, filed Aug. 28, 1997; (4) application Ser. No. 60/057,163, filed Aug. 28, 1997; (5) application Ser. No. 60/057,122, filed Aug. 28, 1997; (6) application Ser. No. 60/057,798, filed Aug. 28, 1997; (7) U.S. Ser. No. 60/057,118, filed Aug. 28, 1997; (8) application Ser. No. 60/059,543, filed Sep. 19, 1997; (9) application Ser. No. 60/059,358, filed Sep. 19, 1997; (10) application Ser. No. 60/065,630, filed Nov. 18, 1997; (11) application Ser. No. 60/065,605, filed Nov. 18, 1997; (12) application Ser. No. 60/065,629, filed Nov. 18, 1997; (13) application Ser. No. 60/066,147, filed Nov. 19, 1997; (14) application Ser. No. 60/066,245, filed Nov. 20, 1997; (15) application Ser. No. 60/066,246, filed Nov. 20, 1997; (16) application Ser. No. 60/066,115, filed Nov. 21, 1997; (17) application Ser. No. 60/066,334, filed Nov. 21, 1997; (18) application Ser. No. 60/066,418, filed Nov. 24, 1997; (19) application Ser. No. 60/071,371, filed Jan. 15, 1998; (20) application Ser. No. 60/070,940, filed Jan. 9, 1998; (21) application Ser. No. 60/072,390, filed Jan. 9, 1998; (22) application Ser. No. 60/070,939, filed Jan. 9, 1998; (23) application Ser. No. 60/070,935, filed Jan. 9, 1998; (24) application Ser. No. 60/074,454, filed Feb. 12, 1998; (25) application Ser. No. 60/076,955, filed Mar. 5, 1998; (26) application Ser. No. 60/076,959, filed Mar. 5, 1998; (27) application Ser. No. 60/076,957, filed Mar. 5, 1998; (28) application Ser. No. 60/076,956, filed Mar. 5, 1998; (29) application Ser. No. 60/076,978, filed Mar. 5, 1998; (30) application Ser. No. 60/078,363, filed Mar. 18, 1998; (31) application Ser. No. 60/08 1,374, filed Apr. 10, 1998; (32) application Ser. No. 60/081,362, filed Apr. 10, 1998; (33) application Ser. No. 60/083,252, filed Apr. 27, 1998; (34) application Ser. No. 60/085,096, filed May 12, 1998; (35) application Ser. No. 60/090,223, filed Jun. 22, 1998; (36) application Ser. No. 60/090,222, filed Jun. 22, 1998; (37) application Ser. No. 60/090,232, filed Jun. 22, 1998; (38) application Ser. No. 60/092,046, filed Jul. 8, 1998; (39) application Ser. No. 60/092,050, filed Jul. 8, 1998; (40) application Ser. No. 60/092,742, filed Jul. 14, 1998; and (41) application Ser. No. 60/093,689, filed Jul. 22, 1998. This application is also a continuation-in-part of copending application Ser. No. 10/063,803, filed May 15, 2002 (Publication No. 2002/0185378, now U.S. Pat. No. 6,822,782), which itself claims benefit of application Ser. No. 60/291,081, filed May 15, 2001. Finally, this application claims benefit of copending application Ser. No. 60/481,572, filed Oct. 28, 2003. The entire contents of all the aforementioned applications, and of all United States Patents, published applications and copending applications mentioned below are herein incorporated by reference.

BACKGROUND OF INVENTION

This invention relates to electrophoretic particles (i.e., particles for use in an electrophoretic medium) and processes for the production of such electrophoretic particles. This invention also relates to electrophoretic media and displays incorporating such particles. More specifically, this invention relates to novel black or dark colored electrophoretic particles.

Particle-based electrophoretic displays, in which a plurality of charged particles move through a suspending fluid under the influence of an electric field, have been the subject of intense research and development for a number of years. Such displays can have attributes of good brightness and contrast, wide viewing angles, state bistability, and low power consumption when compared with liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. The optical property is typically color perceptible to the human eye, but may be another optical property, such as optical transmission, reflectance, luminescence or, in the case of displays intended for machine reading, pseudo-color in the sense of a change in reflectance of electromagnetic wavelengths outside the visible range. It is shown in the U.S. Published application No. 2002/0180687 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Nevertheless, problems with the long-term image quality of electrophoretic displays have prevented their widespread usage. For example, particles that make up electrophoretic displays tend to settle, resulting in inadequate service-life for these displays.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspension medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; 6,545,291; 6,580,545; 6,639,578; 6,652,075; 6,657,772; 6,664,944 and 6,680,725; and U.S. Patent applications Publication Nos. 2002/0019081; 2002/0021270; 2002/0053900; 2002/0060321; 2002/0063661; 2002/0063677; 2002/0090980; 2002/0106847; 2002/0113770; 2002/0130832; 2002/0131147; 2002/0145792; 2002/0171910; 2002/0180687; 2002/0180688; 2002/

0185378; 2003/0011560; 2003/0011868; 2003/0020844; 2003/0025855; 2003/0034949; 2003/0038755; 2003/0053189; 2003/0076573; 2003/0096113; 2003/0102858; 2003/0132908; 2003/0137521; 2003/0137717; 2003/0151702; 2003/0189749; 2003/0214695; 2003/0214697 and 2003/0222315; and International applications Publication Nos. WO 99/67678; WO 00/05704; WO 00/38000; WO 00/38001; WO 00/36560; WO 00/67110; WO 00/67327; WO 01/07961; WO 01/08241; and WO 03/104884.

Known electrophoretic media, both encapsulated and unencapsulated, can be divided into two main types, referred to hereinafter for convenience as "single particle" and "dual particle" respectively. A single particle medium has only a single type of electrophoretic particle suspended in a suspending medium, at least one optical characteristic of which differs from that of the particles. (In referring to a single type of particle, we do not imply that all particles of the type are absolutely identical. For example, provided that all particles of the type possess substantially the same optical characteristic and a charge of the same polarity, considerable variation in parameters such as particle size and electrophoretic mobility can be tolerated without affecting the utility of the medium.) When such a medium is placed between a pair of electrodes, at least one of which is transparent, depending upon the relative potentials of the two electrodes, the medium can display the optical characteristic of the particles (when the particles are adjacent the electrode closer to the observer, hereinafter called the "front" electrode) or the optical characteristic of the suspending medium (when the particles are adjacent the electrode remote from the observer, hereinafter called the "rear" electrode (so that the particles are hidden by the suspending medium).

A dual particle medium has two different types of particles differing in at least one optical characteristic and a suspending fluid which may be uncolored or colored, but which is typically uncolored. The two types of particles differ in electrophoretic mobility; this difference in mobility may be in polarity (this type may hereinafter be referred to as an "opposite charge dual particle" medium) and/or magnitude. When such a dual particle medium is placed between the aforementioned pair of electrodes, depending upon the relative potentials of the two electrodes, the medium can display the optical characteristic of either set of particles, although the exact manner in which this is achieved differs depending upon whether the difference in mobility is in polarity or only in magnitude. For ease of illustration, consider an electrophoretic medium in which one type of particles is black and the other type white. If the two types of particles differ in polarity (if, for example, the black particles are positively charged and the white particles negatively charged), the particles will be attracted to the two different electrodes, so that if, for example, the front electrode is negative relative to the rear electrode, the black particles will be attracted to the front electrode and the white particles to the rear electrode, so that the medium will appear black to the observer. Conversely, if the front electrode is positive relative to the rear electrode, the white particles will be attracted to the front electrode and the black particles to the rear electrode, so that the medium will appear white to the observer.

If the two types of particles have charges of the same polarity, but differ in electrophoretic mobility (this type of medium may hereinafter to referred to as a "same polarity dual particle" medium), both types of particles will be attracted to the same electrode, but one type will reach the electrode before the other, so that the type facing the observer differs depending upon the electrode to which the particles are attracted. For example suppose the previous illustration is modified so that both the black and white particles are positively charged, but the black particles have the higher electrophoretic mobility. If now the front electrode is negative relative to the rear electrode, both the black and white particles will be attracted to the front electrode, but the black particles, because of their higher mobility will reach it first, so that a layer of black particles will coat the front electrode and the medium will appear black to the observer. Conversely, if the front electrode is positive relative to the rear electrode, both the black and white particles will be attracted to the rear electrode, but the black particles, because of their higher mobility will reach it first, so that a layer of black particles will coat the rear electrode, leaving a layer of white particles remote from the rear electrode and facing the observer, so that the medium will appear white to the observer: note that this type of dual particle medium requires that the suspending fluid be sufficiently transparent to allow the layer of white particles remote from the rear electrode to be readily visible to the observer. Typically, the suspending fluid in such a display is not colored at all, but some color may be incorporated for the purpose of correcting any undesirable tint in the white particles seen therethrough.

Both single and dual particle electrophoretic displays may be capable of intermediate gray states having optical characteristics intermediate the two extreme optical states already described.

Some of the aforementioned patents and published applications disclose encapsulated electrophoretic media having three or more different types of particles within each capsule. For purposes of the present application, such multiparticle media are regarded as sub-species of dual particle media.

Also, many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned 2002/0131147. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the suspending fluid are not encapsulated within microcapsules but instead are retained within a plurality of cavities formed within a carrier medium, typically a polymeric film. See, for example, International Application Publication No. WO 02/01281, and published U.S. application No. 2002/0075556, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, the aforementioned U.S. Pat. Nos. 6,130,774 and 6,172,798, and U.S. Pat. Nos. 5,872,552; 6,144,361; 6,271,823; 6,225,971; and 6,184,856. Dielectrophoretic displays, which are similar to electrophoretic displays but rely upon variations in electric field strength, can operate in a similar mode; see U.S. Pat. No. 4,418,346.

An encapsulated or microcell electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; inkjet printing processes; and other similar techniques.) Thus, the resulting display can be flexible. Further, because the display medium can be printed (using a variety of methods), the display itself can be made inexpensively.

However, the electro-optical properties of encapsulated electrophoretic displays could still be improved. Among the remaining problems of encapsulated electrophoretic displays are so-called "rapid white state degradation", a relatively rapid decline in the reflectivity of the white optical state of the display during the first few days of operation. Another problem, which is discussed in detail in the aforementioned 2003/0137521 and WO 03/107315, is so-called "dwell state dependency", which causes the change in optical state of an electrophoretic medium produced by a specific waveform to vary depending upon the time for which the electrophoretic medium has been in a particular optical state before the waveform is applied. Finally, it is advisable to make the white optical state of the display whiter and the black optical state darker.

As discussed in the aforementioned E Ink and MIT patents and applications, the presently preferred form of electrophoretic medium comprises white titania and carbon black particles in a hydrocarbon suspending fluid, this hydrocarbon being used alone or in admixture with a chlorinated hydrocarbon or other low dielectric constant fluid. Most other prior art electrophoretic displays which require a black pigment have also used carbon black for this purpose, apparently largely because the material is readily available in mass quantities and very inexpensive. However, the present inventors and their co-workers have discovered that the aforementioned problems with prior art electrophoretic displays are associated with the use of carbon black for the black electrophoretic particles. Carbon black has a complex and poorly understood surface chemistry, which may vary widely with the specific raw material (typically petroleum) and the exact process used for the carbon black production. Carbon black pigment particles also have a poorly understood aggregate, fractal structure. Furthermore, carbon black is notoriously effective in adsorbing gases and liquids with which it comes into contact, and such adsorbed gases and liquids can change the physicochemical properties of the carbon black surface. Hence, it is difficult to ensure consistent surface properties of carbon black from batch to batch. This is especially problematic in electrophoretic displays, since the electrophoretic particles used are typically so small (of the order of 1 $\mu$m) that their properties are dominated by the properties of their surfaces.

It has also been discovered (although this information is not disclosed in the prior art) that carbon black presents certain peculiar difficulties in obtaining proper charging of particles in opposite charge dual particle electrophoretic displays. Specifically, it has been found that when using carbon black and titania as the black and white particles respectively in an opposite charge dual particle electrophoretic display, combinations of charging agents and other materials which produce all positively charged carbon black particles tend to produce a minor proportion of titania particles which are also positively charged. The resultant mixture of negatively and positively charged titania particles leads to contamination of the extreme optical states of the medium, thus adversely affecting its contrast ratio.

Carbon black also has a low density. While this does not affect the operation of the display itself, it does complicate the manufacture of encapsulated dual particle displays. For reasons explained in several of the aforementioned E Ink and MIT patents, it is desirable that an encapsulated electrophoretic medium comprises a single, substantially close-packed layer of capsules. Also, when such an electrophoretic medium is produced by coating capsules on to a substrate, it is desirable that the exposed surface of the capsule layer be reasonably flat, since otherwise difficulties may be encountered in laminating the capsule layer to other layers in the final display. Production of such a substantially close-packed layer with a reasonably flat exposed surface is best achieved by coating capsules which are of substantially the same size. However, the encapsulation processes described in aforementioned E Ink and MIT patents produce capsules having a broad range of sizes, and hence it is necessary to separate out the capsules having the desired range of sizes. Many useful processes for sorting capsules by size rely upon using the density difference between the capsules and a surrounding medium to effect the desired sorting. The low density of carbon black, coupled with the small concentration at which it is used in most electrophoretic media, lead to capsule densities close to that of water, hindering the sorting process.

There is thus a need for a black particle for use in electrophoretic media that does not suffer from the problems associated with the use of carbon black. However, the search for such a black particle is subject to considerable difficulties. Although the optical properties of numerous pigments are of course known from their use in the paint and similar industries, a pigment for use in an electrophoretic display must possess several properties in addition to appropriate optical properties. The pigment must be compatible with the numerous other components of the electrophoretic medium, including the suspending fluid, any other pigment particles present, charge control agents and surfactants typically present in the suspending fluid, and the capsule wall material (if a capsule wall is present). The pigment particles must also be able to sustain a charge when suspended in the suspending fluid, and the zeta potentials of the particles caused by such charges should all be of the same polarity and should not extend over an excessively wide range, or the electrophoretic medium may not have desirable electro-optic properties; for example, if some particles have very low zeta potentials, a very long driving pulse may be required to move such particles to a desired position within the electrophoretic medium, resulting in slow switching of the medium. It will be appreciated that such information relating to the ability of pigment particles to acquire and hold charges is not available for most pigments potentially usable in an electrophoretic display, since such electrical properties are irrelevant to the normal commercial uses of the pigments.

The aforementioned copending application Ser. No. 09/140,846 mentions numerous pigments that are potentially useful in an electrophoretic display. It has now been found that one of these pigment, namely copper chromite ($Cu_2Cr_2O_3$) has particular advantages for use in electrophoretic media and displays, and this invention relates to electrophoretic media and displays containing copper chromite. It has also been found that certain surface treatments, in particular the formation of layers of silica and formation of polymers attached to the copper chromite particle, substantially as described in the aforementioned copending applications Ser. Nos. 10/063,803 and 60/481,572, improve the performance of the copper chromite particle in electrophoretic media and displays, and this invention also relates to such modified copper chromite particles and electrophoretic media and displays containing them.

SUMMARY OF INVENTION

Accordingly, in one aspect this invention provides an electrophoretic medium comprising at least one electrically charged particle suspended in a suspending fluid and capable of moving through the fluid on application of an electrical field to the fluid. According to the present invention, the at least one electrically charged particle comprises copper chromite.

In such an electrophoretic medium, the at least one electrically charged particle may have an average diameter of from about 0.25 to about 5 $\mu$m. The at least one electrically charged particle may be coated with silica and/or have a polymer chemically bonded to, or cross-linked around, the at least one particle. It is generally preferred that the polymer be chemically bonded to the at least one particle. The polymer coating should correspond to between 5 and 500 mg/m$^2$ of particle surface area (as measured by the BET technique or other suitable method), more preferably to between 10 and 100 mg/m$^2$, and most preferably to between 20 and 100 mg/m$^2$. The polymer may comprise from about 1 to about 15 percent by weight, preferably from about 2 to about 8 percent by weight, of the at least one particle. The polymer may comprise charged or chargeable groups, for example amino, carboxyl, or sulfonate groups. The polymer may also comprise a main chain and a plurality of side chains extending from the main chain, each of the side chains comprising at least about four carbon atoms. The polymer may be formed by radical polymerization from acrylate, methacrylate, styryl, or other vinyl monomers or mixtures thereof. The polymerization can take place in one step or in multiple sequential steps.

As described in more detail below, the polymer may be bonded to the particle via a residue of a functionalization agent, for example a silane. The residue of the functionalization agent may comprise charged or chargeable groups.

The electrophoretic medium of the invention may be of any of the aforementioned types but preferably comprises at least one second particle having at least one optical characteristic differing from that of the copper chromite particle(s), the at least one second particle also having an electrophoretic mobility differing from that of the copper chromite particle(s). The copper chromite particles and the second particles may bear charges of opposite polarity. The second particles may be substantially white, a preferred white pigment for this purpose being titania. In the electrophoretic medium of the invention, the suspending fluid may comprise a hydrocarbon, or a mixture of a hydrocarbon and a halogenated hydrocarbon.

The electrophoretic medium of the present invention may be of the encapsulated type and comprise a capsule wall within which the suspending fluid and the at least one particle are retained. Such an encapsulated medium may comprise a plurality of capsules each comprising a capsule wall and the suspending fluid and at least one particle retained therein, the medium further comprising a polymeric binder surrounding the capsules.

This invention extends to an electrophoretic display comprising an electrophoretic medium of the present invention and at least one electrode disposed adjacent the electrophoretic medium for applying an electric field to the medium. In such an electrophoretic display, the electrophoretic medium may comprise a plurality of capsules. Alternatively, the electrophoretic medium may be of the polymer-dispersed type and comprise a plurality of droplets comprising the suspending fluid and a continuous phase of a polymeric material surrounding the droplets. The electrophoretic display may also be of the microcell type and comprise a substrate having a plurality of sealed cavities formed therein, with the suspending fluid and the copper chromite particles retained within the sealed cavities.

In another aspect, this invention provides a copper chromite particle having a silica coating. Preferably, such a copper chromite particle has a mean diameter in the range of about 0.25 to about 5 $\mu$m.

In another aspect, this invention provides a copper chromite particle having a polymer chemically bonded to, or cross-linked around, the particle. Preferably, the polymer is chemically bonded to the particle. The polymer coating should correspond to between 5 and 500 mg/m$^2$ of pigment surface area (as measured by the BET technique or other suitable method), more preferably to between 10 and 100 mg/m$^2$, and most preferably to between 20 and 100 mg/m$^2$. The polymer may comprise from about 1 to about 15 percent by weight, preferably from about 2 to about 8 percent by weight, of the particle. The polymer (or a residue of a functionalization agent bonding the polymer to the particle, as previously discussed) may comprise charged or chargeable groups, for example amino groups. The polymer may comprise a main chain and a plurality of side chains extending from the main chain, each of the side chains comprising at least about four carbon atoms. The polymer may be formed by radical polymerization from acrylate. methacrylate, styryl, or other vinyl monomers or mixtures thereof In another aspect, this invention provides a process for producing a polymer-coated copper chromite particle; this process comprises:

(a) reacting the particle with a reagent having a functional group capable of reacting with, and bonding to, the particle, and also having a polymerizable or polymerization-initiating group, thereby causing the functional group to react with the particle surface and attach the polymerizable group thereto; and (b) reacting the product of step (a) with at least one monomer or oligomer under conditions effective to cause reaction between the polymerizable or polymerization-initiating group on the particle and the at least one monomer or oligomer, thereby causing the formation of polymer bonded to the particle.

In this process, the copper chromite particle may be coated with silica prior to step (a). The reagent used in step (a) may comprise a silane coupling group, for example a trialkoxysilane coupling group. The reagent may further comprise an amino group. For example, the reagent may comprise a N-[3-(trimethoxysilyl)propyl]-N'-(4-vinylbenzyl)ethylenediamine salt. The monomer or oligomer may comprise at least one acrylate. methacrylate, styrryl, or other vinyl monomer or mixtures thereof, for example lauryl methacrylate, 2-ethylhexyl methacrylate, hexyl methacrylate, and other alkyl esters of methacrylic acid and acrylic acid, hexafluorobutyl methacrylate and other halogen-containing monomers, styrene and substituted styrene derivatives, vinyl halides, for example, vinyl chloride, vinylidene chloride, vinylidene fluoride, and the like, vinyl ethers and esters, for example, methyl vinyl ether, and vinyl acetate, and other substituted vinyl derivatives, including maleic anhydride and maleic esters, vinyl pyrrolidone and the like. In addition, the polymerization may include other reagents to modify the molecular weight of the polymer, for example, chain-transfer agents, such as carbon tetrabromide, mercapto-derivatives, or other such materials as known in the vinyl polymerization art.

DETAILED DESCRIPTION

Figure 1:
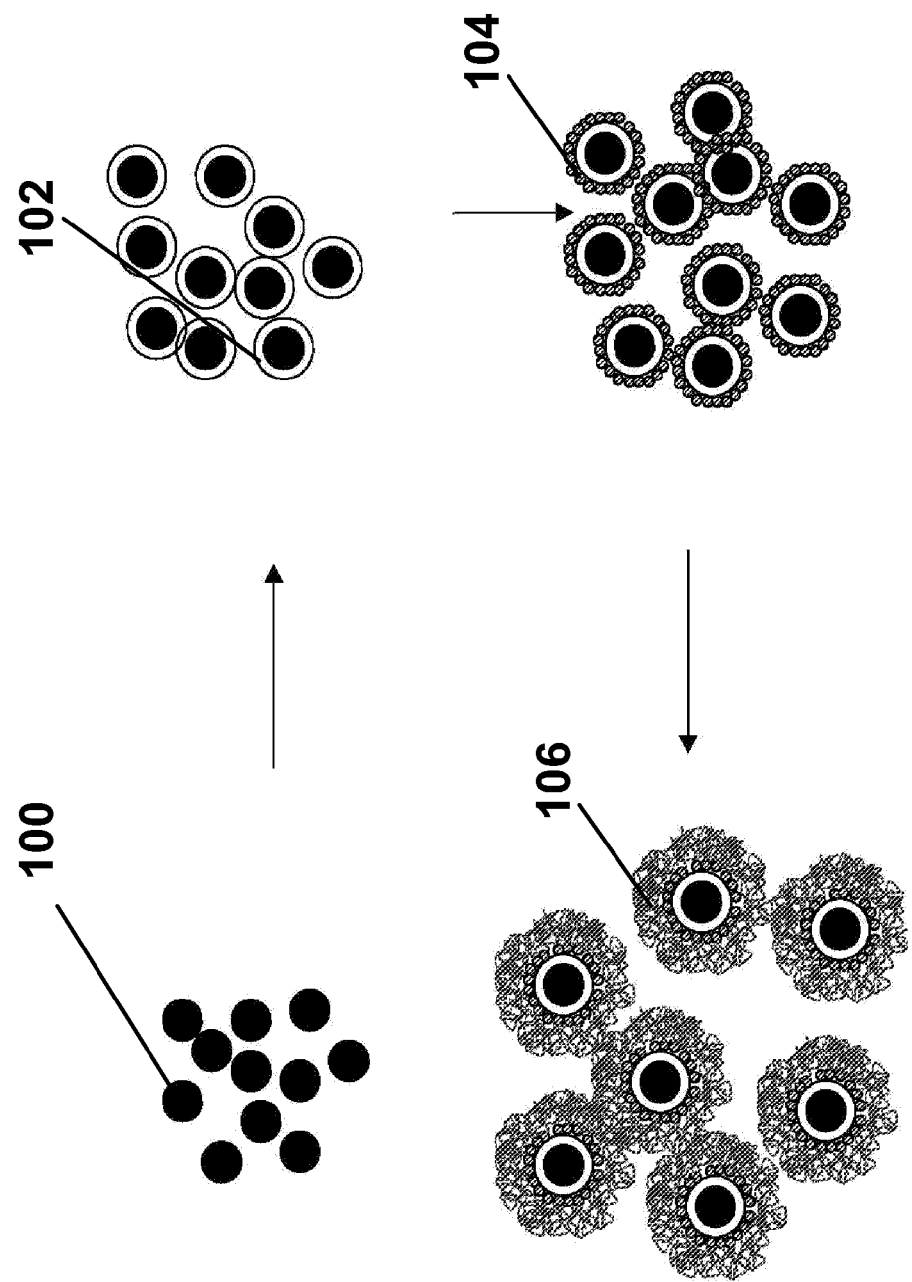
FIG. 1 shows schematically a process for preparing electrophoretic particles by the process of the present invention.

As already mentioned, this invention relates to electrophoretic particles comprising copper chromite, to processes for the production of such particles, and to electrophoretic media and displays containing such particles.

Copper chromite has a number of advantages for use as an electrophoretic particle. It is readily available commercially in substantial quantities, the presently preferred commercial form being the material sold under the trade name Shepherd Black 1G by Shepherd Color Company, 4539 Dues Drive, Cincinnati, Ohio 45246. This pigment is a calcined particulate pigment with an average size of about 1 $\mu$m, specific gravity of 5.5, and surface area of 2.7 m$^2$/g. A second pigment, Shepherd Black 1, from the same supplier, has also been found to give satisfactory results; this pigment has the same composition as Black 1G but a slightly larger particle size (1.2 $\mu$m) and slightly smaller surface area (2.1 m$^2$/g).

Copper chromite has a more consistent surface chemistry than carbon black. For optimum performance as an electrophoretic particle, the copper chromite should be provided with a polymer coating of the type described in the aforementioned copending application Ser. No. 10/063,803. In one embodiment of the invention, it is preferred that the copper chromite be coated with silica prior to the formation of the polymer coating. The silica coating may also be prepared by a process as described in the aforementioned copending application Ser. No. 10/063,803. The polymer coating, and optional silica coating, provide the copper chromite with an engineered and well-defined surface which is accurately reproducible from batch to batch.

The polymer coating may be of any of the types described in the aforementioned copending applications Ser. Nos. 10/063,803 and 60/481,572, and in view of the large number of processes for forming such polymer coatings described in these copending applications, only the presently preferred processes for forming the polymer coatings on copper chromite particles will be described in detail below, although it is again stressed that any of the processes for forming such polymer coatings described in these copending applications may be used in the present invention. Thus, although the polymer coating may be chemically bonded to, or cross-linked around, the copper chromite particle, the former is generally preferred. The polymer coating is preferably formed by (a) reacting the particle with a reagent (a "functionalization agent") having a functional group capable of reacting with, and bonding to, the particle, and also having a polymerizable or polymerization-initiating group, thereby causing the functional group to react with the particle surface and attach the polymerizable group thereto; and (b) reacting the product of step (a) with at least one monomer or oligomer under conditions effective to cause reaction between the polymerizable or polymerization-initiating group on the particle and the at least one monomer or oligomer, thereby causing the formation of polymer bonded to the particle.

The reagent used step (a) of this process has a functional group capable of bonding to the particle and a polymerizable or polymerization-initiating group, which is used in step (b) to cause formation of polymer. If, as is typically the case, the copper chromite particle is coated with silica prior to step (a), the reagent needs to react with the silica coating rather than a copper chromite surface, and convenient reagents for reacting with such a silica surface are silanes, especially trialkoxysilanes. The polymerizable group is conveniently a vinyl group. The polymer coating desirably contains charged or chargeable groups, since the presence of such groups assists in controlling and maintaining a stable charge on the copper chromite particles in the electrophoretic medium. Such groups are conveniently present in the reagent used in step (a), although they can also be present in the monomers used in step (b); for example, if a positively charged copper chromite particle is desired, the reagent may contain amino groups. (In practice, it is generally convenient to make the copper chromite particles positively charged; the aforementioned E Ink and MIT patents and applications describe opposite charge dual particle electrophoretic media containing negatively charged white titania particles and positively charged carbon black particles. When replacing the carbon black particles with copper chromite particles in accordance with the present invention, it is convenient to keep the same charging scheme with the negatively charged white titania particles and to make the black copper chromite particles positively charged.) Preferred amino reagents for this purpose are N-[3-(trimethoxysilyl)propyl]-N'-(4-vinylbenzyl) ethylenediamine salts, especially the hydrochloride, for convenience hereinafter referred to as "TMSP". If a negatively charged copper chromite particle is desired, conveniently the silane of the formula:

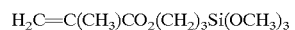

$H_2C=C(CH_3)CO_2(CH_2)_3Si(OCH_3)_3$ sold commercially under the Registered Trade Mark Z6030, is used.

The monomer used in step (b) of the process for forming the polymer coating is conveniently an acrylate or methacrylate, although as already mentioned a wide variety of other monomers may be used; as will readily be apparent to those skilled in polymer synthesis, it is normally necessary to include a free radical polymer initiator in the reaction mixture to enable the vinyl or other polymerizable group derived from the reagent used in step (a) of the process to react with the acrylate or methacrylate monomer to form the polymer. As discussed in more detail in the aforementioned copending application Ser. No. 10/063,803, it is generally desirable that the polymer used to form the polymer coating comprise a main chain and a plurality of side chains extending from the main chain, each of the side chains comprising at least about four carbon atoms; this type of "brush" polymer is believed to spread out into a brush or tree-like structure in the hydrocarbon suspending fluids commonly used in electrophoretic media, thus increasing the affinity of the electrophoretic particles for the suspending fluid and thus the stability of the particle dispersion. Side chains substantially larger than four carbon atoms are useful in achieving an optimum brush structure, and the presently preferred monomers for forming the polymer coating are lauryl methacrylate and 2-ethylhexyl methacrylate. For reasons discussed in detail in the aforementioned copending application Ser. No. 60/481,572, it may be advantageous to include a minor proportion of a second monomer, for example styrene or a fluorinated monomer, with the lauryl- or 2-ethylhexyl methacrylate or other acrylate or methacrylate monomer.

The electrophoretic properties of the copper chromite particle may be affected by the amount of polymer coating. Generally, it is preferred that the polymer comprise between about 5 and about 500 mg/m$^2$ of pigment surface area (as measured by the BET technique or other suitable method), more preferably to between 10 and 100 mg/m$^2$, and most preferably to between 20 and 100 mg/m$^2$. As illustrated in the Examples, below, one preferred process produces a polymer coating constituting about 4 percent by weight of the particle, corresponding to about 40 mg m$^{-2}$ using the aforementioned Shepherd 1G as the base particle.

For various reasons discussed below, in step (b) of the process, it is often desirable to incorporate more than one type of monomer (or oligomer) into the polymer coating, and two different approaches may be used to form such "multiple monomer" coatings. The first approach is a single stage copolymerization using a mixture of the relevant monomers. The second approach uses two or more successive polymerization steps (in effect, splitting step (b) of the process into two or more sub-steps), each of which uses a different monomer or mixture of monomers. For example, as illustrated in the Examples below, a first polymerization with lauryl methacrylate may be followed by a second polymerization with styrene. It will readily be apparent to those skilled in polymer technology that the properties of the polymer-coated particles produced by the two approaches may differ, since the first approach produces a random copolymer, whereas the second approach produces a block copolymer or mixture of homopolymers.

The electrophoretic media and displays produced using the copper chromite particles of the present invention may be of any of the aforementioned types. Thus, the media and displays may be of the single particle, opposite polarity dual particle or same polarity dual particle types. Similarly, the media and displays may be of the unencapsulated, encapsulated, polymer-dispersed and microcell types. The replacement of the carbon black particles typically used in prior art electrophoretic media and displays with copper chromite particles in accordance with the present invention will typically require the use of a substantially greater weight of copper chromite particles than carbon black particles because of the much greater density of copper chromite; the optimum amount of copper chromite to be used in any specific electrophoretic medium may be determined empirically, and the Examples below illustrate typical amounts. Apart from this difference in amount of pigment, electrophoretic media and displays using copper chromite can generally use the same technology as similar media and displays using carbon black, and the reader is referred to the aforementioned E Ink, MIT and other patents and applications for fuller information.

FIG. 1 of the accompanying drawings shows schematically a process for preparing electrophoretic particles in accordance with the present invention, this process being essentially similar to that described in the aforementioned copending application Ser. No. 10/063,803. In the first stage of the process, a copper chromite pigment particle 100 is coated with silica to form a silica coating 102; this step is fully described in the aforementioned copending application Ser. No. 10/063,803 and a preferred process is described in Example 1 below. Next, the silica-coated pigment is treated with a bifunctional reagent having one functional group which reacts with the silica surface, and a second, charge control group, thus producing a surface functionalized copper chromite pigment bearing charge control groups 104 on its surface. The bifunctional reagent also provides a site for the formation of polymer on the pigment particle. Finally, as shown in FIG. 1, the surface functionalized pigment is contacted with one or more monomers or oligomers under conditions effective to cause formation of polymer 106 attached to the charge control groups, thereby producing a colloidally stable copper chromite pigment ready for use in an electrophoretic medium.

The following Examples, are now given, though by way of illustration only, to show preferred reagents, conditions and techniques useful in the practice of the present invention.

EXAMPLE 1

Silica Coating of Copper Chromite Pigment

A dispersion was prepared consisting of Shepherd Black 1G (50 g), water (420 mL) and sodium silicate solution (6 mL of a solution containing approximately 14% of sodium hydroxide and 27% of silica, available from Aldrich Chemical Company); the dispersion was sonicated for one hour. The dispersion was then added to a 1 L three-necked flask equipped with a stirring bar, reflux condenser (open to the air) and two addition funnels equipped with needle-valve control stopcocks. The flask was partially immersed in a silicone oil bath and heated to 100° C. with rapid stirring over a period of one hour. During this heating period, the first addition funnel was charged with 0.22M sulfuric acid (150 mL) and the second with a mixture of the aforementioned sodium silicate solution (11 mL) and water (70 mL). After the silicone oil bath reached 100° C., the two solutions in the addition funnels were simultaneously added to the dispersion in the flask over a period of two hours. The heat was then turned off and the bath and flask were allowed to cool slowly to room temperature. Stirring was then continued overnight. The silicated dispersion was then poured into centrifuge bottles and centrifuged at 3600 rpm for 10 minutes. The supernatant solution was decanted and discarded, and fresh deionized water was added to the bottles, which were shaken to re-suspend the sediment, and then re-centrifuged at 3600 rpm for 10 minutes. After decantation of the supernatant solution a second time, the bottles were covered loosely and the sedimented pigment allowed to air dry. The pigment thus produced was then placed in a crystallization dish and dried in a 105° C. oven for two days. The dried pigment was hand ground using a mortar and pestle and sieved using a 1.0 mm stainless steel mesh screen. Finally, the sieved pigment was finely ground using 2 inch (51 mm) jet mill Micronizer (available from Sturtevant Inc., Hanover, Mass.) using 100 psi (0.8 mPa) air and a pigment feed rate of about 250 g/hr.

EXAMPLE 2

Silane Treatment of Silicated Copper Chromate Pigment

The silica-coated copper chromite pigment produced in Example 1 was used without further treatment in a silanization process. For this purpose, a mixture of 300 ml of ethanol, 30 ml of water and 40 g of a 40 weight percent solution of N-[3-(trimethoxysilyl)propyl]-N'-(4-vinylbenzyl)ethylenediamine hydrochloride (available from United Chemical Technologies, 2731 Bartram Road, Bristol, Pa. 19007-6893) in methanol was stirred rapidly for 7 minutes, the pigment was added thereto, and the resultant mixture was stirred for a further 5 minutes. The resultant suspension was poured into plastic bottles and centrifuged at 3500 rpm for 30 minutes. The supernatant liquor was decanted, and the silanized pigment redispersed in ethanol and centrifuged at 3500 rpm for 30 minutes, and the liquid decanted. The washing was repeated, and the pigment finally dried in air for 18 hours, then under vacuum at 70° C. for 2 hours. The amount of surface functionalization was estimated by thermogravimetric analysis (TGA), which indicated the presence of 1.5–1.7% of volatile (organic) material, implying a surface coverage of 19–22 $\mu$mol/m$^2$, representing substantially more than a monolayer of the silane.

EXAMPLE 3

Polymer Coating of Silanized Copper Chromate Pigment

The silanized pigment produced in Example 2 (50 g) was placed in a round-bottomed flask with toluene (50 g) and 2-ethylhexyl methacrylate monomer (50 g). The resultant mixture was stirred rapidly under a nitrogen atmosphere (argon may alternatively be used) for 20 minutes, then slowly heated to 50° C. and AIBN (0.5 g in 10 ml of toluene) added quickly. The suspension was then heated to 65° C. and stirred at this temperature under nitrogen for a further 18 hours. The resultant suspension was poured into plastic bottles, the flask being washed out with ethyl acetate to remove residual product and the ethyl acetate solution added to the bottles. The bottles were centrifuged at 3500 rpm for 30 minutes. The supernatant liquor was decanted, and the polymer-coated pigment re-dispersed in ethyl acetate and centrifuged at 3500 rpm for 30 minutes, and the liquid decanted. The washing was repeated, and the pigment dried in air until a workable powder was obtained, and then under vacuum at 65° C. for 6 to 18 hours. This polymerization resulted in a final pigment containing 3.5–4.5% volatile material by TGA.

EXAMPLE 4

Preparation of Dual Particle Electrophoretic Display Containing Copper Chromite Pigment This Example illustrates the conversion of the polymer-coated copper chromite pigment produced in Example 3 above to an encapsulated opposite charge dual particle electrophoretic display using a process substantially as described in the aforementioned copending application Ser. No. 10/065,803. The titania pigment used was also polymer-coated essentially as described in Example 28 of this copending application.

Part A: Preparation of Internal Phase

An internal phase (i.e., an electrophoretic suspension comprising the two types of electrophoretic particles, the suspending fluid and certain additives) was prepared by combining the following constituents in a 4L plastic bottle:

Copper chromite (53.4 weight percent dispersion in Isopar G) 1070.09 g

Titania (60 weight percent dispersion in Isopar G): 2380.95 g

Polyisobutylene (13 weight percent dispersion in Isopar G) 143.08 g

Solsperse 17K (10 weight percent solution in Isopar G) 400.00 g

Additional Isopar G: 5.88 g

The resultant mixture was sonicated for 1 hour by immersion in a sonicating water bath, and then rolled overnight on a mechanical roller to produce an internal phase ready for encapsulation.

Part B: Encapsulation

Deionized water (2622 g) was added to a 4 L jacketed reactor equipped with a prop stirrer and warmed to 42.5° C. using a circulating controlled temperature bath. Gelatin (66.7 g) was hydrated by sprinkling the powdered material onto the surface of the water in the reactor and allowing the suspension to stand for 1 hour. The stirrer was then set at 100 rpm and the solution stirred for 30 minutes. The stirring rate was then increased to 350 rpm and the internal phase prepared in Part A above was added over a period of five minutes using a sub-surface addition funnel. Immediately after the addition of the internal phase had been completed, the stirring rate was increased to 500 rpm for 1 hour to produce internal phase droplets in the correct size range. During this emulsification, a solution of 66.7 g of gum acacia dissolved in 656 g of water was warmed to 40° C. At the end of the emulsification period, the acacia solution was added all at once to the internal phase suspension, and the pH of the suspension was adjusted to 5.0 by addition of 3.5 g of 10 weight percent acetic acid.

The bath temperature on the circulator was then changed to 8° C. When the temperature of the suspension reached 10° C. (after 2–3 hours), 16.7 g of 50 percent glutaraldehyde solution in water was added. The bath temperature was then set at 25° C., and the suspension warmed and stirred overnight. The resultant encapsulated material was isolated by sedimentation, washed with deionized water, and size-separated by sieving, using sieves of 38 and 25 $\mu$m mesh. Analysis using a Coulter Multisizer showed that the resulting capsules had a mean size of 40 $\mu$m and more than 85 percent of the total capsule volume was in capsules having the desired size of between 30 and 50 $\mu$m.

Part C: Preparation of Capsule Slurry

Following the size separation described in Part B above, the capsules were allowed to settle and all excess water was decanted. The resulting capsule slurry was adjusted to pH 8 with 1 weight percent ammonium hydroxide solution. The capsules were then concentrated by centrifugation and the supernatant liquid discarded. The capsules were mixed with an aqueous urethane binder at a ratio of 1 part by weight binder to 8 parts by weight of capsules and 0.1 weight percent Triton X-100 surfactant and 0.2 weight percent of hydroxypropylmethyl cellulose (both based on the total weight of capsule slurry and binder) were added and mixed thoroughly.

Part D: Manufacture of Display

The mixture produced in Part C above was bar-coated, using a 4 mil (101 μm) coating slot, on to a 125 μm thick indium-tin oxide (ITO)-coated polyester film, the capsules being deposited on the ITO-coated surface of the film. The resulting coated film was dried in an oven at 60° C. for 1 hour.

Separately, a polyurethane lamination adhesive was coated on the a release sheet to form a dried adhesive layer 55 μm thick, and the resultant coated sheet was cut to a size slightly larger than that of the capsule-coated film. The two sheets were then laminated together (with the lamination adhesive in contact with the capsule layer) by running them through a Western Magnum roll laminator with the top roll set at 279° C. and the bottom roll set at 184° C. to form a front plane laminate as described in copending application Ser. No. 10/249,957, filed May 22, 2003. The front plane laminate was then cut to the desired size, the release sheet removed, and the lamination adhesive layer thereof laminated to a backplane comprising a polymeric film covered with a graphite layer, the lamination adhesive being contacted with the graphite layer. This second lamination was effected using the same laminator but with a top roll temperature of 259° C. and a bottom roll temperature of 184° C. The laminated pixels were cut out using a laser cutter, and electrical connections applied to produce experimental single-pixel displays suitable for use in the electro-optic tests described in Example 5 below.

To provide controls for use in these electro-optic tests, a similar prior art dual particle electrophoretic display was produced using as the black pigment a polymer-coated carbon black prepared essentially as described in Example 27 of the aforementioned copending application Ser. No. 10/063,803.

EXAMPLE 5

Electro-Optic Properties of Display Containing Copper Chromite Pigment

Figure 2:
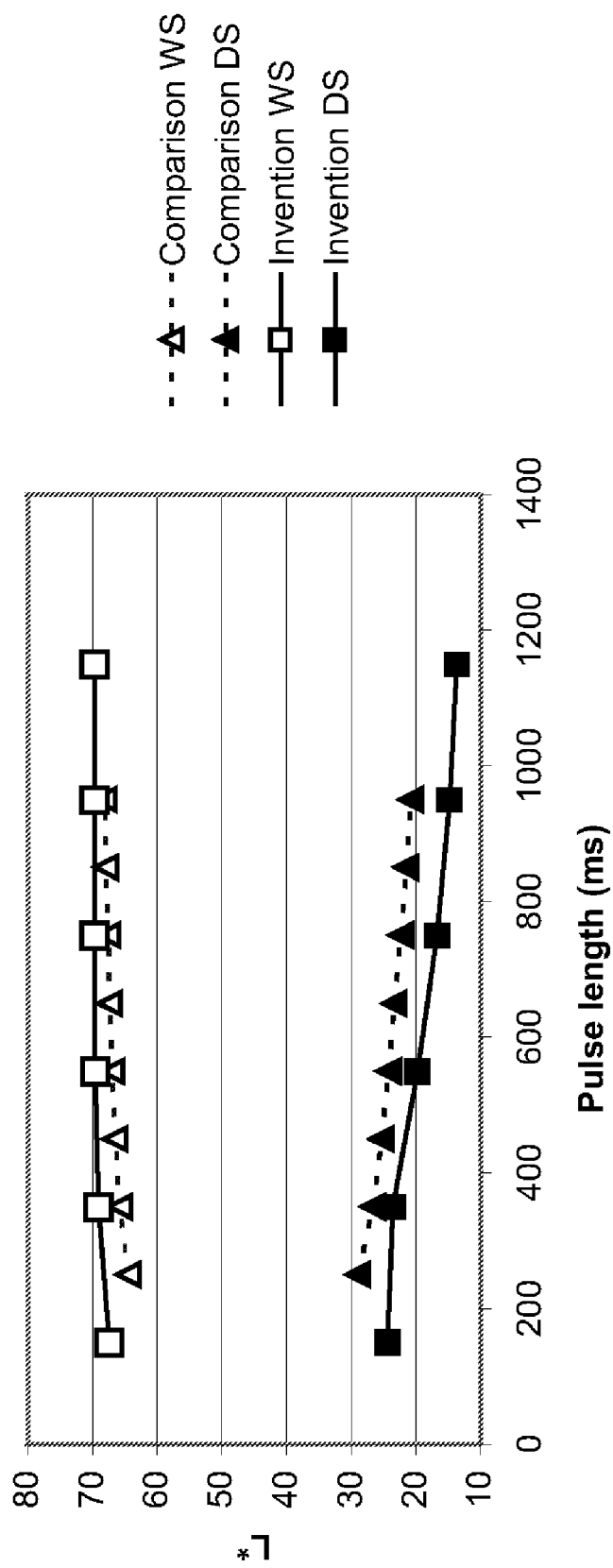
FIG. 2 is a graph comparing the electro-optic properties of dual particle electrophoretic media using copper chromite and carbon black electrophoretic particles, as described in Example 5 below.

The experimental displays produced in Example 4 above were tested by switching them through several transitions between their extreme black and white optical states. To test the variation of white state with applied pulse length, a display was driven to its black state, then 15 V square wave pulses of varying duration were applied and the resultant white state measured. The variation of dark state with applied pulse length was tested in the same way but starting with the display in its white state. The reflectance of the state produced by the driving pulse was measured, and expressed in L* units, where L* has the usual CIE definition. FIG. 2 of the accompanying drawings shows the results obtained for both the displays of the present invention and the prior art displays.

From FIG. 2 it will be seen that the display of the present invention has both whiter white states and darker dark states than the prior art display when operated at the same pulse length and voltage. As a result, the contrast ratio for the display of the present invention is substantially higher; for example, at a pulse length of 550 ms, the prior art display has a contrast ratio of 8.8, whereas the display of the invention has a contrast ratio of 13.7.

Further tests were conducted to measure the dwell state dependence of the two types of display. As explained above, dwell state dependence ("DSD") is a phenomenon which causes the response of a pixel of a display to an applied driving pulse to vary with the time for which the pixel has previously remained in the same optical state. This is a problem in electrophoretic displays, where the time for which a specific pixel remains in the same optical state before being switched to a new optical state can vary greatly. To test dwell state dependence, the previous tests were substantially repeated, except that the display was left for a rest length ("RL") of either 50 or 4050 milliseconds in its previous state before the driving pulse was applied, and the driving pulse had a fixed duration of 350 msec at 15 V. The results are shown in the Table 1 below.

TABLE 1

| Display | White state 50 ms RL | White state 4050 ms RL | ΔWS | Dark state 50 ms RL | Dark state 4050 ms RL | ΔDS |
|---|---|---|---|---|---|---|
| Control | 68.7 | 66.4 | −2.3 | 22.9 | 26.3 | +4.3 |
| Present Invention | 67.1 | 65.7 | −1.4 | 24.4 | 22.4 | −2.0 |

As is well known to those skilled in display technology, a change less than or equal to 2 units in L* is regarded as a satisfactory performance, since changes of this magnitude are either invisible to the eye or nearly so, whereas greater changes than this cause visually unattractive artifacts. Hence Table 1 shows that the prior art display would produce such artifacts under the test conditions, whereas the display of the present invention would not.

The density of the capsules produced in Example 4, Part B above was also measured. It was found that the capsules of the present invention had a specific gravity of approximately 1.15, whereas the control capsules had a specific gravity of approximately 1.06. Since many techniques for size separation of capsules, such as centrifugation, depend upon the difference between the density of capsules and water, it will readily be apparent that the capsules of the present invention could be size separated much more quickly than the control capsules, or, from a practical perspective, that a given separation apparatus can process a much greater throughput of the capsules of the present invention than the control capsules, and hence that for any given production rate, the size and cost of the separation apparatus can be reduced.

EXAMPLE 6

Alternative Process for Silica-Coating and Silanization of Copper Chromite Pigment Copper chromite (Shepherd Black 1G, 50 g) was placed in a sodium silicate solution (430 ml of a 0.073M solution with 1.9% sodium hydroxide), and the resultant mixture was rapidly stirred and then sonicated at 30–35° C. The suspension was then heated to 90–95° C. over a period of 1 hour and sulfuric acid (150 mL of a 0.22M solution) and additional sodium silicate (75 mL of a 0.83M solution with 0.2% sodium hydroxide) were added simultaneously over a period of 2.5 to 3 hours, with stirring. After these additions had been completed, the reaction mixture was stirred for an additional 15 minutes, then cooled to room temperature. Additional sulfuric acid (18 mL of 1M acid) was then added to the reaction mixture to lower its pH from about 9.5–10 to about 3. The reaction mixture was then placed in plastic bottles and centrifuged at 3700 rpm for 15 minutes, and the supernatant liquid decanted. Immediately after this decantation, deionized water (5 mL) and ethanol (50 mL) were added to each bottle, which was then shaken vigorously. The bottles were then sonicated for 1 hour. Microscopic investigation of the resultant dispersion revealed well-dispersed primary pigment particles.

The dispersion of silica-coated copper chromite pigment thus produced was used without any further treatment in a silanization process. For this purpose, a mixture of 300 ml of ethanol, 30 ml of water and 40 g of a 40 weight percent solution of N-[3-(trimethoxysilyl)propyl]-N'-(4-vinylbenzyl)ethylenediamine hydrochloride in methanol was stirred rapidly for 7 minutes, the pigment dispersion was added thereto, and the resultant mixture was stirred for a further 5 minutes. The resultant suspension was poured into plastic bottles and centrifuged at 3500 rpm for 30 minutes. The supernatant liquor was decanted, and the silanized pigment redispersed in ethanol and centrifuged at 3500 rpm for 30 minutes, and the liquid decanted. The washing was repeated, and the pigment finally dried in air for 18 hours, then under vacuum at 70° C. for 2 hours.

EXAMPLE 7

Copper Chromite Pigment Polymer-Coated with a Mixture of Monomers

This Example illustrates the use of copper chromite pigments having a polymer coating derived from more than one monomer. These experiments use a white titania pigment based on Dupont Ti-Pure R960 and a black copper chromite pigment based on Shepherd Black 1G. These particles were surface functionalized as per FIG. 1 using Z6030 for the white pigment and TMSP for the black. As previously mentioned, the white particles are negatively charged when incorporated into an Isopar G suspending fluid including Solsperse 17K and Span as charging agents, and the black particles are positively charged. The particles with lauryl methacrylate homopolymer shells are similar to those used in Example 5 above and are referred to by the letters J and D for white particles and black particles respectively. Modification of the polymer shell will be described as follows: for particles made using a random copolymer, one-stage polymerization, the comonomer will be identified by the letter codes indicated in Table 2 in parentheses after the appropriate pigment indicator, together with a number indicating the mole fraction of the comonomer used in the polymerization reaction. The majority comonomer in each case is lauryl methacrylate. Thus, the notation J(BMA15) indicates a white pigment made from a polymerization mixture comprising 15 mole % t-butyl methacrylate and 85 mole % lauryl methacrylate. A two-stage polymerization will be indicated by a plus sign; in general, the mole ratio of polymers for these particles is not so well known, so that no indication is given about composition. Thus, J(+St) indicates a white pigment made by a two-stage polymerization. The starting material was the pigment with 100 mole percent lauryl methacrylate used in the first stage polymerization; the second stage polymerization was carried out using only styrene as the polymerizable monomer.

TABLE 2

| Monomer | Shorthand symbol |
| --- | --- |
| styrene | St |
| t-butyl methacrylate | TBMA |
| vinyl pyrrolidone | VP |

The procedures used for formation of the polymer shells were as follows:

1. Standard Lauryl Methacrylate Polymerization

A single-neck, 250 mL round bottom flask was equipped with a magnetic stir bar, reflux condenser and an argon/or nitrogen inlet and placed in a silicon oil bath. To the flask was added 60 g of silane coated pigment which was pulverized into a fine powder using a mortar and pestle, followed by 60 mL of lauryl methacrylate (LMA, Aldrich) and 60 mL of toluene. The reaction mixture was then stirred rapidly and the flask purged with argon or nitrogen for one hour. During this time the silicon bath was heated to 50° C. During the purge, 0.6 g of AIBN (2,2'-azobisisobutyronitrile, Aldrich) was dissolved in 13 mL of toluene. At the end of the one-hour purge the AIBN/toluene solution was added quickly with a glass pipette. The reaction vessel heated to 65° C. and allowed to stir overnight. At the end of the polymerization, to the viscous reaction mixture was added 100 mL of ethyl acetate and the mixture allowed to stir for another 10 minutes. The mixture was poured into plastic bottles, centrifuged for 15–20 minutes at 3600 rpm and decanted. Fresh ethyl acetate was added to centrifuged pigment, which was resuspended by stirring with a stainless steel spatula and sonicating for 10 minutes. The pigment was washed twice more with ethyl acetate followed above procedure. The pigment was allowed to air dry overnight followed by drying under high vacuum for 24 hours. The free polymer in bulk solution was precipitated in methanol and dried under vacuum. The molecular weight of free polymer in the solution was determined by gas phase chromatography (GPC). The polymer bound on the pigment was measured by TGA.

2. Co-Polymerization of Z6030-Coated Titania

A single-neck, 250 mL round bottom flask was equipped with a magnetic stir bar, reflux condenser and an argon/or nitrogen inlet and placed in a silicon oil bath. To the flask were added 60 mL of toluene, 60 g of PD65 (Z6030-coated titania (derived from R960 Titanium Oxide pigment, supplied by Dupont de Nemours and Company, Inc.), lauryl methacrylate (LMA) and a second monomer, such as styrene, t-butyl methacrylate, 1-vinyl-2-pyrrolidinone, hexafluorobutyl acrylate or methacrylate, N-isopropylacrylamide or acrylonitrile (Aldrich), the amounts of LMA and second monomer depending on the desired monomer ratio. The ratios of LMA/second monomer were usually 95/5, 85/15 and 75/25. The reaction mixture was then stirred rapidly and the flask purged with argon or nitrogen for one hour. During this time the silicon bath was heated to 50° C. During the purge, 0.6 g of AIBN was dissolved or partially dissolved in 13 mL of toluene. At the end of the one hour purge the AIBN/toluene solution was added quickly with a glass pipette. The reaction vessel was heated to 65° C. and allowed to stir overnight. To the viscous reaction mixture was added 100 mL of ethyl acetate and the resultant mixture was allowed to stir for another 10 minutes. The mixture was poured into plastic bottles and centrifuged for 15–20 minutes at 3600 rpm and decanted. Fresh ethyl acetate was added to the centrifuged pigment, and the resulting mixture stirred with a stainless steel spatula and sonicated for 10 minutes. The pigment was washed twice more with ethyl acetate, centrifuged and decanted. The pigment was allowed to air dry overnight followed by drying under high vacuum for 24 hours. The free polymer in bulk solution was precipitated in methanol and dried under vacuum. The molecular weight of free polymer in the solution was determined by GPC. The polymer bound on the pigment was measured by TGA.

2.1 LMA and 1-vinyl-2-pyrrolidinone Copolymerization of Z6030 Coated R960

A single-neck, 250 mL round bottom flask was equipped with a magnetic stir bar, reflux condenser and an argon/or nitrogen inlet and placed in a silicon oil bath. To the flask were added 60 mL of toluene, 60 g of PD65 (Z6030 coated Dupont R960), 51 mL of lauryl methacrylate (LMA) and 3.3 mL of 1-vinyl-2-pyrrolidinone, corresponding to a mole ratio of LMA/1-vinyl-2-pyrrolidinone of 85/15. The reaction mixture was then stirred rapidly and the flask purged with argon or nitrogen for one hour. During this time the silicon bath was heated to 50° C. During the purge, 0.6 g of AIBN was dissolved or partially dissolved in 13 mL of toluene. At the end of the one hour purge the AIBN/toluene solution was added quickly with a glass pipette. The reaction vessel was sealed, heated to 65° C. and allowed to stir overnight. To the viscous reaction mixture was added 100 mL of ethyl acetate and the resultant mixture was allowed to stir for another 10 minutes. The mixture was poured into plastic bottles and centrifuged for 15–20 minutes at 3600 rpm and decanted. Fresh ethyl acetate was added to the centrifuged pigment, and the resultant mixture was stirred with a stainless steel spatula and sonicated for 10 minutes. The pigment was washed twice more with ethyl acetate, centrifuged and decanted. The pigment was allowed to air dry overnight followed by drying under high vacuum for 24 hours. The free polymer in bulk solution was precipitated in methanol and dried under vacuum. The molecular weight of free polymer in the solution was determined by GPC. The polymer bound on the pigment was measured by TGA.

3. Second Stage Polymerization from LMA Coated White Pigment

A single-neck, 250 mL round bottom flask was equipped with a magnetic stir bar, reflux condenser and an argon/or nitrogen inlet and placed in a silicon oil bath. To the flask was added 60 g of Z6030-coated pigment that had been pulverized into a fine powder using a mortar and pestle, followed by 60 mL of lauryl methacrylate and 60 mL of toluene. The reaction mixture was then stirred rapidly and the flask purged with argon or nitrogen for one hour. During this time the silicon bath was heated to 50° C. During the purge, 0.6 g of AIBN was dissolved in 13 mL of toluene. At the end of the one hour purge the AIBN/toluene solution was added quickly with a glass pipette. The reaction vessel was sealed, heated to 65° C. and allowed to stir overnight. At the end of the polymerization, to the viscous reaction mixture was added 100 mL of ethyl acetate and the resultant mixture was allowed to stir for another 10 minutes. The mixture was poured into plastic bottles and centrifuged for 15–20 minutes at 3600 rpm and decanted. Fresh ethyl acetate was added to the centrifuged pigment, and the resultant mixture stirred with a stainless steel spatula. The pigment was washed twice more with ethyl acetate following above procedure. The pigment was allowed to air dry overnight followed by drying under high vacuum for 24 hours. The free polymer in bulk solution was precipitated in methanol and dried under vacuum for GPC test. The free polymer in bulk solution was precipitated in methanol and dried under vacuum. The molecular weight of free polymer in the solution was determined by GPC. The polymer bound on the pigment was measured by TGA.

Another single-neck, 250 mL round bottom flask was equipped with a magnetic stir bar, reflux condenser and an argon/or nitrogen inlet and placed in a silicon oil bath. To the flask was added 50 g of the LMA-coated pigment prepared above, which was pulverized into a fine powder using a mortar and pestle, followed by 85 mL of toluene and 16 g of styrene. The reaction mixture was then stirred rapidly and the flask purged with argon or nitrogen for one hour. During this time the silicon bath was heated to 50° C. During the purge, 0.4 g of AIBN was dissolved in 10 mL of toluene. At the end of the one hour purge the AIBN/toluene solution was added quickly with a glass pipette. The reaction vessel was sealed, heated to 65° C. and allowed to stir overnight. At the end of polymerization, to the viscous reaction mixture were added 100 mL of ethyl acetate and the resultant mixture was allowed to stir for another 10 minutes. The mixture was poured into plastic bottles and centrifuged for 15–20 minutes at 3600 rpm and decanted. Fresh ethyl acetate was added to the centrifuged pigment, and the resultant mixture was stirred with a stainless steel spatula and sonicated for 10 minutes. The pigment was washed twice more with ethyl acetate following the above procedure. The pigment was allowed to air dry overnight followed by drying under high vacuum for 24 hours. The free polymer in bulk solution was precipitated in methanol and dried under vacuum. The molecular weight of free polymer in the solution was determined by GPC. The polymer bound on the pigment was measured by TGA.

4. Co-Polymerization of TMSP-Coated Shepherd Black 1G

A single-neck, 250 mL round bottom flask was equipped with a magnetic stir bar, reflux condenser and an argon inlet and placed in a silicon oil bath. To the flask was added 60 g of TMSP-coated copper chromite pigment, which was pulverized into a fine powder using a mortar and pestle, followed by 1.2 mL of styrene, 57 mL of lauryl methacrylate and 60 mL of toluene. The reaction mixture was then stirred rapidly and the flask purged with argon or nitrogen for one hour and the silicon bath was heated to 50° C. During the purge, 0.6 g of AIBN was dissolved or partially dissolved in 13 mL of toluene. At the end of the one-hour purge the AIBN/toluene solution was added quickly with a glass pipette. The reaction vessel was sealed, heated to 65° C. and allowed to stir overnight. To the viscous reaction mixture was added 100 mL of ethyl acetate and the resultant mixture was allowed to stir for another 10 minutes. The mixture was poured into plastic bottles and centrifuged for 15–20 minutes at 3600 rpm and decanted. Fresh ethyl acetate was added to the centrifuged pigment, and the resultant mixture was stirred with a stainless steel spatula and sonicated for 10 minutes. The pigment was washed twice more with ethyl acetate, centrifuged and decanted. The pigment was allowed to air dry overnight followed by drying under high vacuum for 24 hours. The free polymer in bulk solution was precipitated in methanol and dried under vacuum. The molecular weight of free polymer in the solution was determined by GPC. The polymer bound on the pigment was measured by TGA.

Preparation of Internal Phase Containing LMA-Coated Electrophoretic Particles

An internal phase was formulated from (a) 85 g of a stock solution of the J pigment containing 60% by weight of LMA-coated titania in Isopar G; (b) 42.5 g of a stock solution of the D pigment containing 60% by weight of LMA-coated copper chromite in Isopar G; (c) 10.71 g of a stock solution containing 10% by weight of Solsperse 17000 in Isopar G; (d) 31.03 g of Isopar G; and (e) 0.77 g Span 85 (a non-ionic surfactant).

To a 250 mL plastic bottle were added the J and D stock solutions, followed by the addition of the Solsperse 17000 solution and the Span 85 and finally the remaining solvent. The resultant internal phase was shaken vigorously for approximately 5 minutes and then placed on a roll mill overnight (at least 12 hours).

Preparation of Internal Phase using Copolymer-Coated White Pigment and LMA-Coated Black Pigment An internal phase was formulated from (a) 40 g of a stock solution of a modified J pigment containing 60% by weight of an LMA/TBMA-coated titania (mole ratio 85/15) in Isopar G; (b) 20 g of a stock solution of the D pigment containing 60% by weight of LMA-coated copper chromite in Isopar G; (c) 5.04 g of a stock solution containing 10% by weight of Solsperse 17000 in Isopar G; (d) 14.60 g of Isopar G; and (e) 0.36 g Span 85 (a non-ionic surfactant).

This internal phase was mixed and stored in the same way as the previous internal phase described above.

Preparation of Internal Phase using LMA-Coated White Pigment and Copolymer-Coated Black Pigment An internal phase was formulated from (a) 40 g of a stock solution of the same j pigment as in the first internal phase, this stock solution containing 60% by weight of an LMA-coated titania in Isopar G; (b) 20 g of a stock solution of the D pigment containing 60% by weight of LMA/St-coated copper chromite (85/15 or 95/5 monomer ratio) in Isopar G; (c) 5.04 g of a stock solution containing 10% by weight of Solsperse 17000 in Isopar G; (d) 14.60 g of Isopar G; and (e) 0.36 g Span 85 (a non-ionic surfactant).

This internal phase was mixed and stored in the same way as the previous internal phases described above.

The internal phases thus produced were encapsulated separately in gelatin/acacia microcapsules substantially as described in Example 4 above. The resulting microcapsules were separated by size and capsules having an average particle size of about 35 µm were used in the following experiments. The microcapsules were mixed into a slurry with a polyurethane binder and coated by a roll-to-roll process at a dry coating weight of 18 g m$^{-2}$ on to the surface of a 7 mil (177 µm) poly(ethylene terephthalate) (PET) film carrying an ITO layer on one surface, the microcapsules being deposited on the ITO-covered surface, substantially as described in Example 4 above. The capsule-bearing film was then formed into a front plane laminate by laminating it to a layer of a polyurethane lamination adhesive carried on a release sheet, this lamination being effected at 65 psig (0.51 mPa) at a speed of 6 inches/min (2.5 mm/sec) using a Western Magnum twin roll Laminator with both rolls held at 120° C. To provide experimental single-pixel displays suitable for use in these experiments, pieces of the resultant front plane laminate has their release sheets removed and were then laminated at 75° C. to a 5 cm by 5 cm PET film covered with a carbon black layer, which served as the rear electrode of the single pixel display.

Image Stability Measurements

The single pixel displays thus produced were switched using a 500 ms square wave pulse at 10 V of alternating sign applied to the top plane (ITO layer) relative to the grounded rear electrode. A rest length of 2 seconds between pulses was used for shakeup switches. Image stability was measured by switching the pixel to the appropriate optical state (white or black), grounding the top plane, and measuring the optical reflectivity continuously for 10 minutes. Optical kickback resulting from remnant voltages in the binder and lamination adhesive layers was assumed to decay in 5–10 seconds. The difference in optical state (measured in L* units) between 5 seconds and 10 minutes was taken to be a measure of the image stability. The results shown in Table 3 were obtained on selected pixels.

TABLE 3

| Pigments | Sample No. | White state IS (dL*) | Black state IS (dL*) |
|---|---|---|---|
| J/D | 1 | −6.3 | 2.7 |
| J(TBMA5)/D | 2 | −2.2 | 2.1 |
| J(TBMA15)/D | 3 | −4.2 | 1.1 |
| J/D(St5) | 4 | −4.7 | 2.0 |
| J/D(St15) | 5 | −4.7 | 1.6 |
| J(TBMA5)/D(St5) | 6 | −3.3 | 1.7 |
| J(TMBA15)/D(St5) | 7 | −1.6 | 3.0 |
| J(+St)/D | 8 | −2.2 | 0.3 |

The J/D pixel containing the two LMA-coated pigments shows relatively good black state stability, but less good white state stability (similar displays using carbon black instead of copper chromite as the black pigment in the suspending fluid show much worse state stability in both white and dark states, as shown above). Any of the copolymer-coated electrophoretic pigments results in an improvement in the image stability relative to the J/D sample, either in white state or black state or in both. Only in one case is the image stability of a "copolymer-coated" pixel less good than the J/D sample (J(TBMA15)/D(St5)), and here the difference is probably within experimental pixel-to-pixel variation. The best overall image stability is afforded by the display made with white pigment synthesized using the two-stage method, with styrene as the second monomer. This display has good image stability in the white state, and excellent image stability in the black state.

Response Time

The response times of the electrophoretic displays shown in Table 3 were measured by measuring the electro-optic response as a function of pulse length at an operating voltage of 10 V. A rest length of 2000 ms was used for all measurements. The electro-optic response, as measured by the difference in L* between the white state and the dark state, was found to saturate at a certain pulse length, and then decline slightly at longer pulse lengths. The J/D pixel (Sample No. 1 in Table 3) and similar pixels containing 0.3 and 0.9% by weight high molecular weight poly-isobutylene (PIB) were included as examples of displays having good image stability. Table 4 shows the pulse length at which the electro-optic response achieves 90% of its value with a 1 second pulse length, for the displays of Table 3.

TABLE 4

| Pigments | Sample No. | Time to 90% saturation (ms) |
|---|---|---|
| J/D (no PIB) | 1 | 294 |
| J(TBMA5)/D | 2 | 173 |
| J(TBMA15)/D | 3 | 281 |
| J/D(St5) | 4 | 325 |
| J/D(St15) | 5 | 375 |
| J(+St)/D | 8 | 380 |
| J/D + 0.9% PIB | 9 | 740 |
| J/D + 0.3% PIB | 10 | 575 |

The samples containing PIB had response times that were substantially longer than those of samples containing copolymer-coated pigments. At least 0.3% PIB is required to obtain adequate image stability in this system, and 0.9% PIB is preferred. Thus the use of copolymer-coated pigments achieves good image stability with response times between 1.5 and 4 times faster than the use of PIB.

Thresholds

Figure 3:
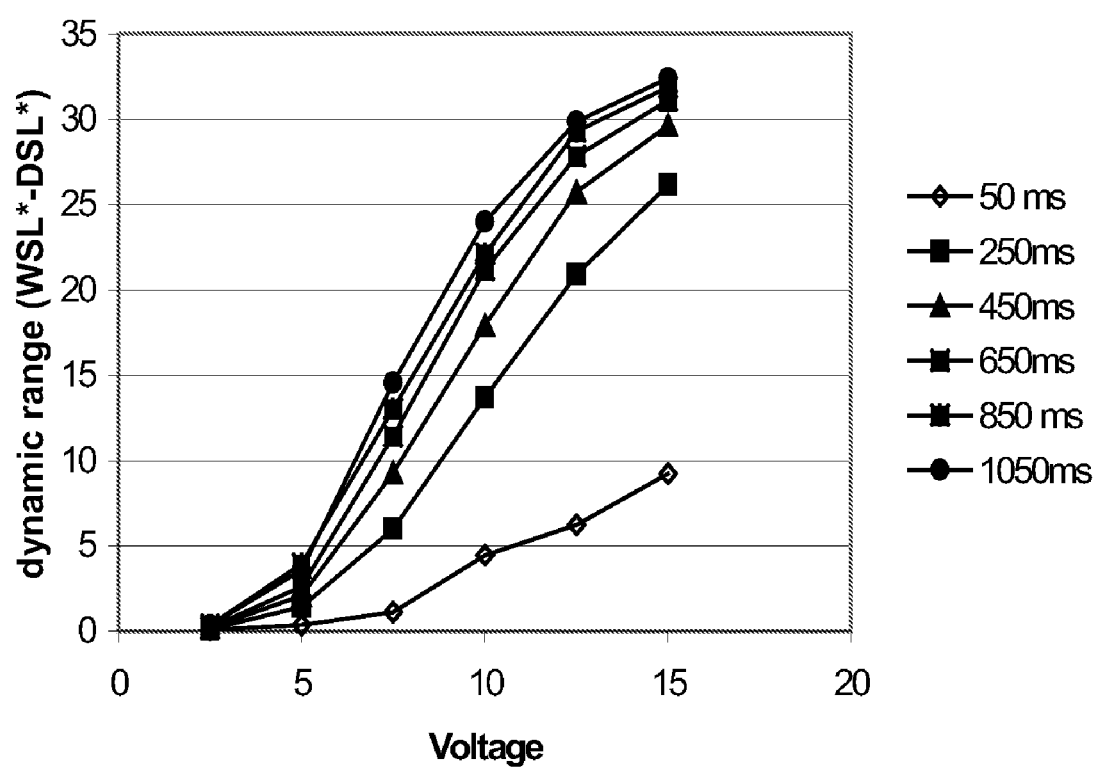
FIG. 3 is a graph showing the threshold behavior of a dual particle electrophoretic medium using a copolymer-coated copper chromite pigment, as described in Example 7 below.

The pixel described above using white pigment with 5 mole % TBMA and black pigment with 15 mole % styrene in their polymer shells, in addition to relatively good image stability, also displayed a large threshold for operation. The threshold is displayed in FIG. 3, which shows the dynamic range of the pixel as a function of the applied voltage for a number of pulse lengths. The dynamic range is very small (of the order of 1 L*) for applied voltages less than 4–5 volts, independent of the pulse length. but a good dynamic range (greater than 30 L*) is exhibited at impulses greater than 600 ms and 10 V.

Thus, displays made with copolymer-coated copper chromite pigment in accordance with the present invention can provide good image stability and have a number of advantages over inclusion of polymers in the suspending fluid, especially in that the use of copolymer-coated pigment does not sacrifice response time to achieve good image stability. This advantage in response time can be used to operating a display at lower voltage. The displays reported in Table 4 switch almost to saturation in 300 ms at 7.5V, and achieve optimal contrast ratio at 10V and 250–300 ms. At 15 volts, switching times of around 100 ms can be achieved.

It will be apparent to those skilled in the art that numerous changes and modifications can be made in the specific embodiments of the present invention described above without departing from the scope of the invention. In particular, although the invention has been described above mainly in connection with encapsulated electrophoretic media having discrete capsules, similar advantages can be achieved by the use of copper chromite pigments of the present invention in other types of electrophoretic media, for example unencapsulated electrophoretic media, polymer-dispersed electrophoretic media and microcell electrophoretic media. Accordingly, the whole of the foregoing description is to be construed in an illustrative and not in a limitative sense.

What is claimed is:

1. An electrophoretic medium comprising at least one electrically charged particle suspended in a suspending fluid and capable of moving through the fluid on application of an electrical field to the fluid, wherein the at least one electrically charged particle comprises copper chromite.

2. An electrophoretic medium according to claim 1 wherein the at least one electrically charged particle has an average diameter of from about 0.25 to about 2 µm.

3. An electrophoretic medium according to claim 1 wherein the at least one electrically charged particle is coated with silica.

4. An electrophoretic medium according to claim 3 wherein the at least one particle has a polymer chemically bonded to the silica coating.

5. An electrophoretic medium according to claim 1 wherein the at least one electrically charged particle has a polymer chemically bonded to, or cross-linked around, the at least one particle.

6. An electrophoretic medium according to claim 5 wherein the polymer is chemically bonded to the at least one particle.

7. An electrophoretic medium according to claim 6 wherein the polymer comprises from about 5 to about 500 mg m$^{-2}$ of the surface area of the at least one particle.

8. An electrophoretic medium according to claim 7 wherein the polymer comprises from about 10 to about 100 mg m$^{-2}$ of the surface area of the at least one particle.

9. An electrophoretic medium according to claim 8 wherein the polymer comprises from about 20 to about 100 mg m$^{-2}$ of the surface area of the at least one particle.

10. An electrophoretic medium according to claim 9 wherein the polymer comprises amino groups.

11. An electrophoretic medium according to claim 7 wherein the polymer comprises from about 2 to about 8 percent by weight of the at least one particle.

12. An electrophoretic medium according to claim 6 wherein the polymer comprises charged or chargeable groups.

13. An electrophoretic medium according to claim 6 wherein the polymer comprises a main chain and a plurality of side chains extending from the main chain, each of the side chains comprising at least about four carbon atoms.

14. An electrophoretic medium according to claim 6 wherein the polymer is formed from an acrylate or a methacrylate.

15. An electrophoretic medium according to claim 6 wherein the polymer is bonded to the at least one particle via a residue of a functionalization agent.

16. An electrophoretic medium according to claim 15 wherein the functionalization agent comprises a silane.

17. An electrophoretic medium according to claim 15 wherein the residue of the functionalization agent comprises charged or chargeable groups.

18. An electrophoretic medium according to claim 1 further comprising at least one second particle having at least one optical characteristic differing from that of the copper chromite particle(s), the at least one second particle also having an electrophoretic mobility differing from that of the copper chromite particle(s).

19. An electrophoretic medium according to claim 18 wherein the copper chromite particle(s) and the second particle(s) bear charges of opposite polarity.

20. An electrophoretic medium according to claim 18 wherein the second particle(s) are substantially white.

21. An electrophoretic medium according to claim 20 wherein the second particle(s) comprise titania.

22. An electrophoretic medium according to claim 1 wherein the suspending fluid comprises a hydrocarbon, or a mixture of a hydrocarbon and a halogenated hydrocarbon.

23. An electrophoretic medium according to claim 1 further comprising a capsule wall within which the suspending fluid and the at least one particle are retained.

24. An electrophoretic medium according to claim 23 comprising a plurality of capsules each comprising a capsule wall and the suspending fluid and at least one particle retained therein, the medium further comprising a polymeric binder surrounding the capsules.

25. An electrophoretic display comprising an electrophoretic medium according to claim 1 and at least one electrode disposed adjacent the electrophoretic medium for applying an electric field to the medium.

26. An electrophoretic display according to claim 25 wherein the electrophoretic medium comprises a plurality of capsules.

27. An electrophoretic display according to claim 25 wherein the electrophoretic medium comprises a plurality of droplets comprising the suspending fluid and a continuous phase of a polymeric material surrounding the droplets.

28. An electrophoretic display according to claim 25 wherein the electrophoretic medium comprises a substrate having a plurality of sealed cavities formed therein, and the suspending fluid and the copper chromite particles are retained within the sealed cavities.

* * * * *